United States Patent [19]

Nakagawa et al.

[11] Patent Number: 5,365,454
[45] Date of Patent: Nov. 15, 1994

[54] LAYOUT DESIGNING METHOD FOR A SEMICONDUCTOR INTEGRATED CIRCUIT DEVICE

[75] Inventors: Shinichi Nakagawa; Hiroyuki Kawai, both of Itami, Japan

[73] Assignee: Mitsubishi Denki Kabushiki Kaisha, Tokyo, Japan

[21] Appl. No.: 777,704

[22] Filed: Oct. 17, 1991

[30] Foreign Application Priority Data

Oct. 18, 1990 [JP] Japan ................. 2-281031

[51] Int. Cl.⁵ ............................. G06F 15/60
[52] U.S. Cl. .................... 364/491; 364/488
[58] Field of Search ............... 364/488, 484, 490, 491

[56] References Cited

U.S. PATENT DOCUMENTS

| | | | |
|---|---|---|---|
| 4,906,872 | 3/1990 | Tanaka | 307/480 |
| 5,047,949 | 9/1991 | Yamaguchi et al. | 364/491 |
| 5,097,422 | 3/1992 | Corbin, II et al. | 364/491 |
| 5,150,309 | 9/1992 | Shaw et al. | 364/491 |
| 5,157,618 | 10/1992 | Ravindra et al. | 364/490 |

OTHER PUBLICATIONS

Weste et al., "CMOS Standard Cell Design", Principles of CMOS VLSI Design–A Systems Perspective, pp. 193-195, 1985.

Primary Examiner—Thomas G. Black
Assistant Examiner—Susan Wieland
Attorney, Agent, or Firm—Lowe, Price, LeBlanc & Becker

[57] ABSTRACT

In a layout designing method for an LSI by a CMOS standard cell method, layout cells (standard layout patterns) which respectively correspond to logical function units are selected from a library. In this selection, the respective layout cells are selected from the library as patterns which are divided into p-type layout cells and n-type layout cells. The p-type layout cells and the n-type layout cells are arranged in accordance with a predetermined logical circuit diagram. Interconnection patterns for interconnecting the p-type layout cells and for interconnecting the n-type layout cells are arranged in accordance with the logical circuit diagram. An excessive interconnection region can be minimized, and efficient interconnections can be achieved. Therefore, an occupied plane area can be reduced in the layout design.

5 Claims, 31 Drawing Sheets

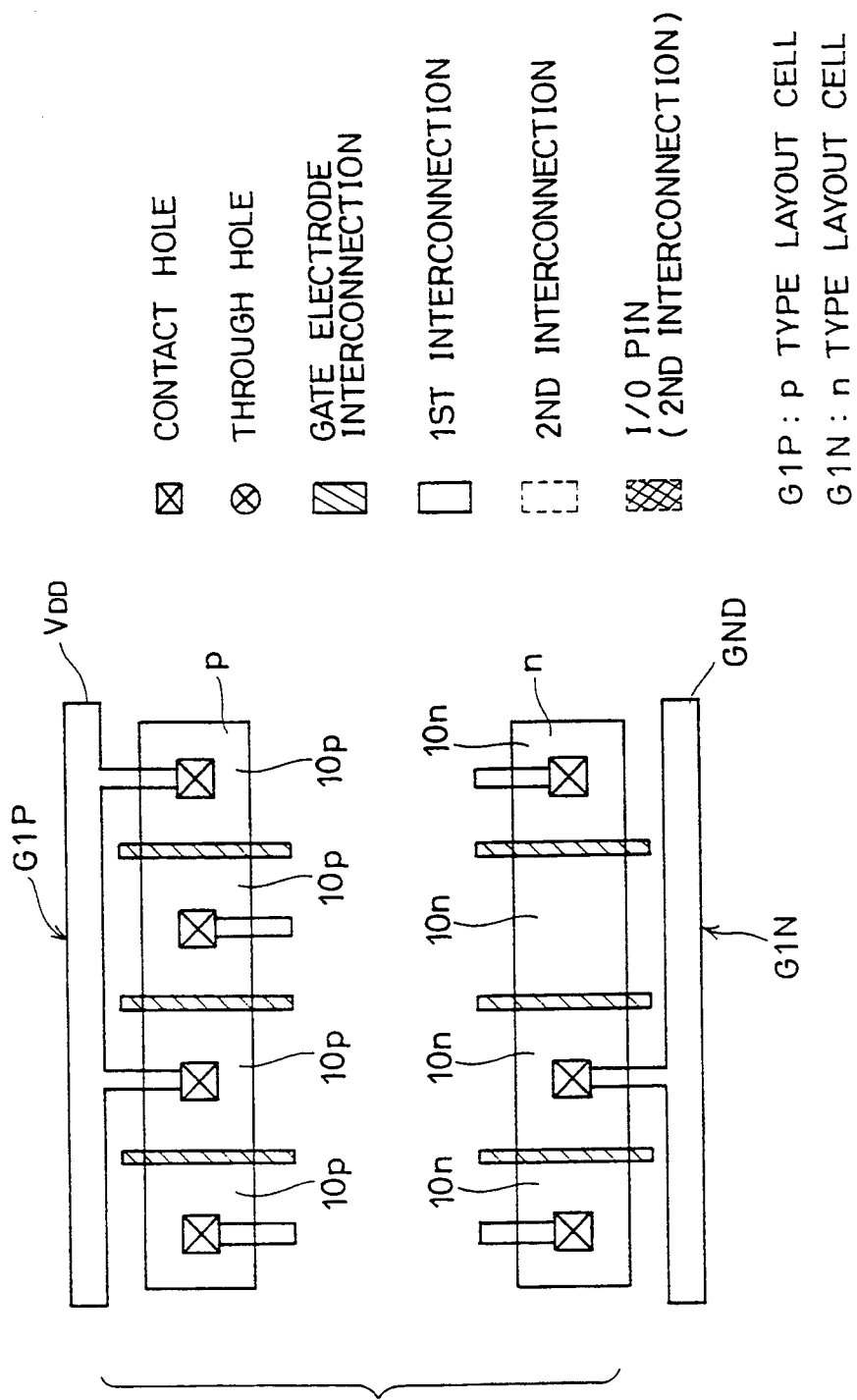

X: CONNECTION NODE

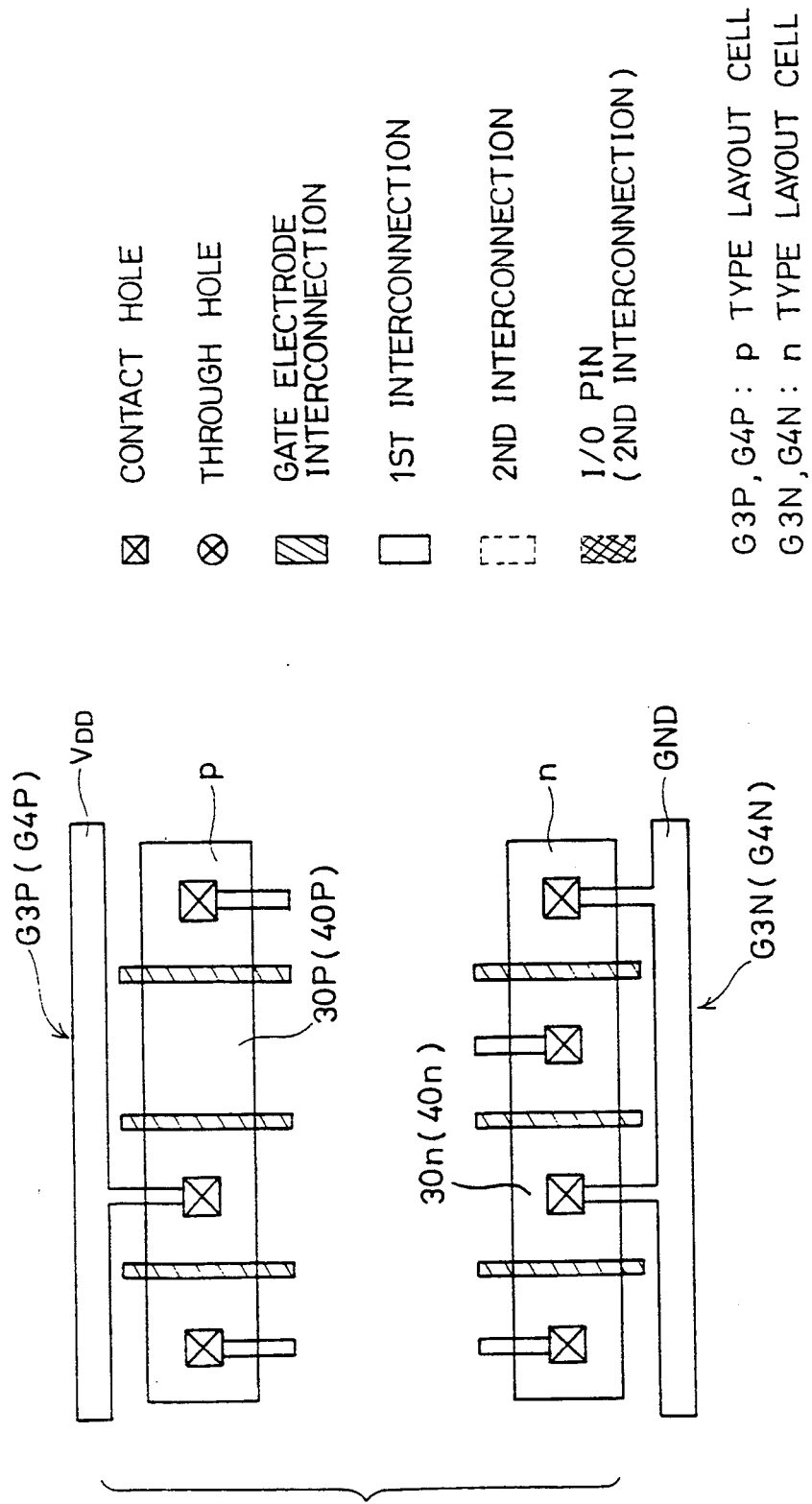

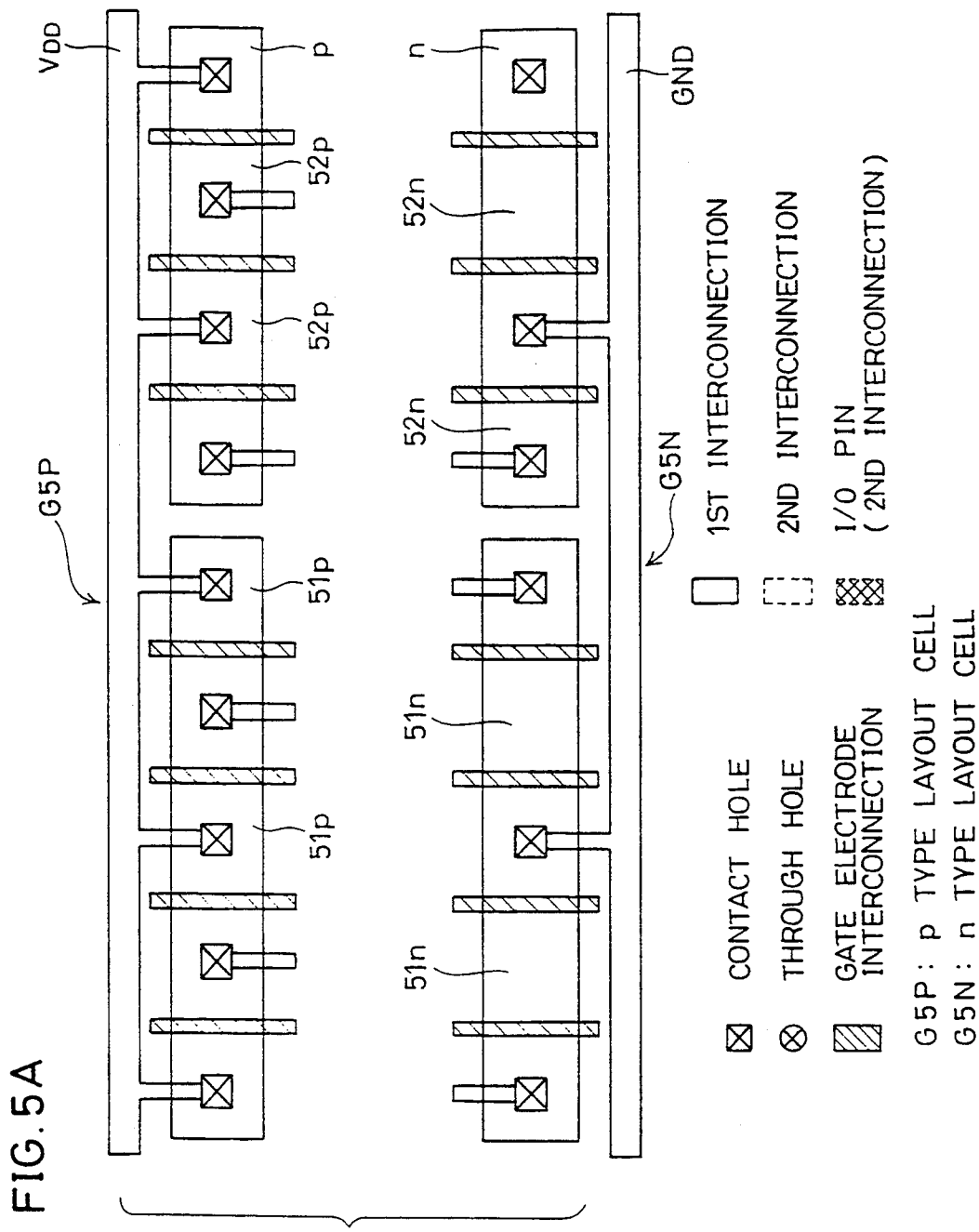

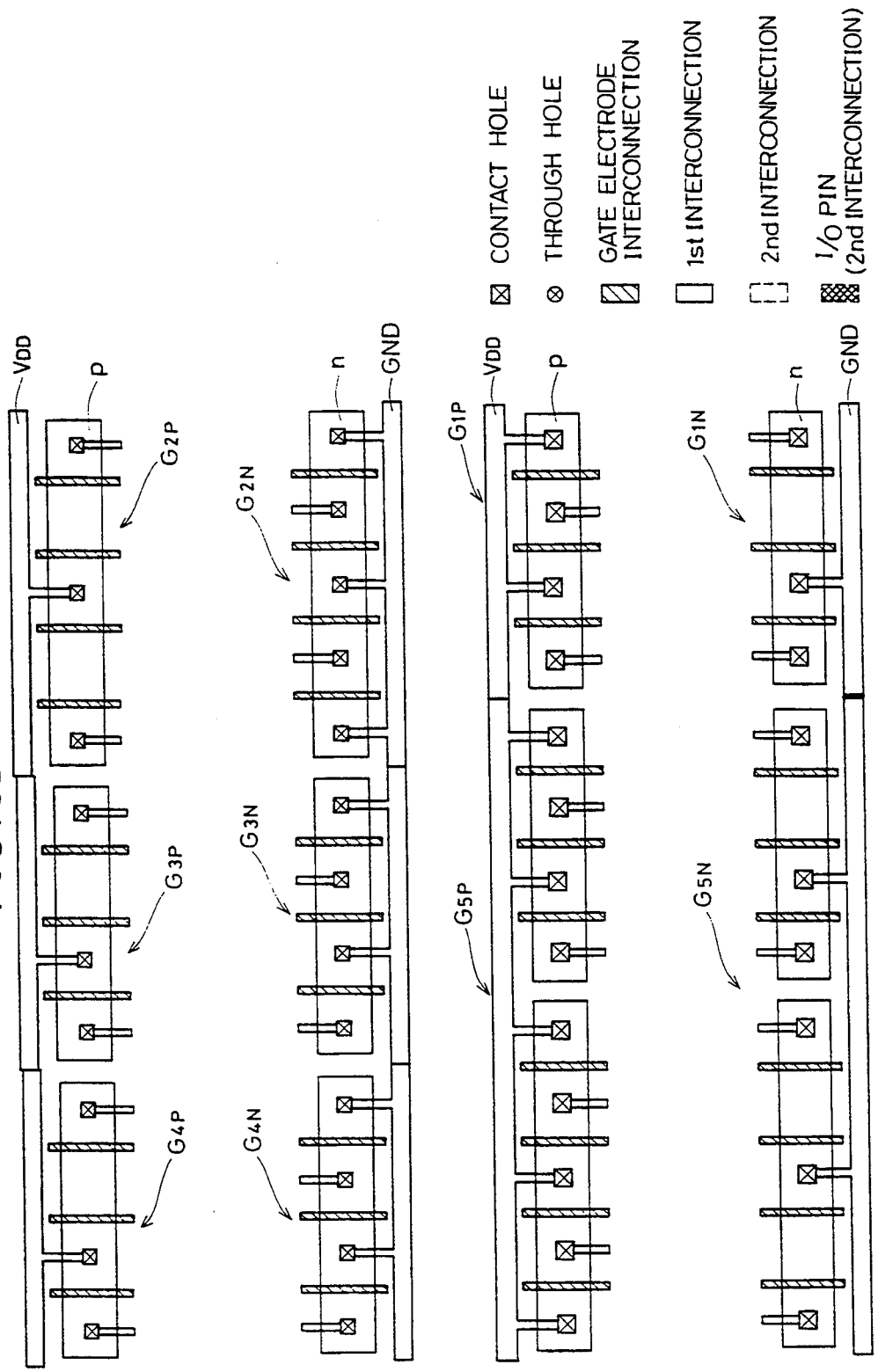

LAYOUT DESIGNING METHOD FOR A SEMICONDUCTOR INTEGRATED CIRCUIT DEVICE

BACKGROUND OF THE INVENTION

1. Field of the Invention

The present invention relates to a layout designing method for a semiconductor integrated circuit device, and particularly to an improvement of a layout designing method for an LSI by a CMOS standard cell method.

2. Description of the Background Art

According to a recent general classifying method, LSIs may be classified into custom LSIs and semicustom LSIs based on an LSI layout design. The custom LSIs may be defined as LSIs of which whole constructions or internal blocks are designed specially for intended particular LSIs. The semicustom LSIs may be defined as LSIs which are designed using libraries in which layout patterns already designed as common circuits are registered. According to this definition, a standard cell method can be classified into a designing method for a semicustom LSI.

In the standard cell method, standard circuit block cells are designed in advance and registered in a cell library for the use in the design of LSIs, and this method is one kind of designing method for the semicustom LSIs. Each circuit block cell is disposed by means of an automatic arranging and interconnecting program of a CAD system. The standard cells which are standard circuit block cells registered in the library usually have layout patterns in which logical circuits such as simple logical gates and flip-flops are designed in advance. Once designed, these standard layout patterns are registered in a data base after their correct operations are verified by simulation and/or experiment. Thereby, the cell library is formed. These standard layout patterns have configurations in which heights are constant and widths are variable. As described above, in the layout design of the LSI by the standard cell method, standard layout patterns are selected from the library and interconnections between the layout patterns are formed by the CAD system.

A prior art example of the layout designing method for the LSIs by the CMOS standard cell method is disclosed in "Principles of CMOS VLSI Design; A System Perspective", Neil H. E. Weste et al., pp 193-195. The prior art method for designing an LSI layout by the CMOS standard cell method will be described below with reference to the figures.

FIG. 7 is a flow chart showing a conventional method for designing the LSI layout by the standard cell method. Referring to FIG. 7, a predetermined logical circuit diagram to be designed is first entered in a CAD system. Here, the layout designing method will be further described with respect to a logical circuit diagram which is shown in FIG. 8 as an example of the entered logical circuit diagram.

In the logical circuit diagram shown in FIG. 8, data is entered from I1-I6 appropriately processed and the data is output from OUT. Tables 1 and 2 are truth tables related to this logical circuit diagram.

TABLE 1

| I4 | I2 | I3 | Q | Q̄ |
|----|----|----|----|----|
| 0 | 0 | 0 | unchanged | |
| 0 | 0 | 1 | | |
| 0 | 1 | 0 | | |
| 0 | 1 | 1 | 0 | 1 |
| 1 | 0 | 0 | 1 | 0 |
| 1 | 0 | 1 | 1 | 0 |
| 1 | 1 | 0 | 1 | 0 |
| 1 | 1 | 1 | inhibited | |

TABLE 2

| I6 | I1 | I5 | OUT |
|----|----|----|----|
| 0 | * | 0 | Q̄ |
| | | 1 | 1 |
| 1 | 0 | * | Q |
| | 1 | * | 1 |

In Table 1, a term "unchanged" indicates a state in which an output state does not change. A term "inhibited" indicates inhibition of input of this combination. In Table 2, a sign "*" indicates 1 or 0. "Q" and "Q̄" indicate that outputs in the truth table shown as the table 1 are output as they are.

The entered logical circuit diagram is formed of circuit blocks G1-G5. An internal logical circuit diagram of the circuit block G2 is shown in FIG. 9. The internal logical circuit diagram of the circuit block G5 is shown in FIG. 10. The logical circuit diagram in FIG. 8 is shown at a logical gate level in FIG. 11. Further, the logical circuit diagram in FIG. 11 is shown as a circuit diagram at a transistor level in FIG. 12.

When the logical circuit diagram shown in FIG. 8 is entered in the CAD system, the logical circuit diagram is divided into logical function units, i.e., the circuit blocks G1-G5. These circuit blocks G1-G5 have been previously designed as standard circuit block cells, and have been registered in a cell library of the CAD system as layout patterns which correspond to respective circuit block cells. Therefore, the standard cells respectively corresponding to the logical function units, i.e., circuit blocks G1-G5 can be selected as the layout cells from the library.

The layout cells corresponding to the circuit blocks G1, G2, G3 (G4) and G5 are shown in FIGS. 13A, 14A, 15A and 16A, respectively. Circuit diagrams at the transistor level corresponding to these circuit blocks G1, G2, G3 (G4) and G5 are shown in FIGS. 13B, 14B, 15B and 16B, respectively.

Referring to FIGS. 13A and 13B, the circuit block G1 is formed of p-channel MOS transistors T11, T12 and T13 and n-channel MOS transistors T14, T15 and T16. The respective MOS transistors are interconnected through first interconnections. Input terminals A and B as well as an output terminal O are disposed at an upper (second) interconnection which is connected to the first interconnection through a through hole. A layout cell corresponding to the circuit block G1 is a standard layout cell having a logical function of an AND gate.

Referring to FIGS. 14A and 14B, the circuit block G2 is formed of p-channel MOS transistors T31, T32, T35 and T36 as well as n-channel MOS transistors T33, T34, T37 and T38. P-regions, n-regions and gate electrode interconnections of the respective MOS transistors are connected together by the first interconnections through contact holes. These first interconnections are connected to upper second interconnections via through holes. Input terminals R and S as well as output terminals Q and Q̄ are disposed at the second interconnections. In the figure, a power supply interconnection $V_{DD}$ is disposed above the p-channel MOS transistors T31, T32, T35 and T36. In the figure, a ground interconnection GND is disposed below the n-channel MOS transistors T33, T34, T37 and T38. In this manner, a standard layout cell of the circuit block G2, i.e., flip-flop gate is formed.

FIG. 15A shows a standard layout cells of the circuit blocks G3 and G4, i.e., OR gates, Referring to FIGS. 15A and 15B, the circuit blocks G3 and G4 are formed of p-channel MOS transistors T21, T22 and T23 as well as n-channel MOS transistors T24, T25 and T26. Similarly to the layout cells of the circuit blocks G1 and G2, p-regions, n-regions and gate electrode interconnections of respective MOS transistor are interconnected by first interconnections through contact holes, and second interconnections are connected to the first interconnections via through holes. The second interconnections are provided with input terminals A and B as well as an output terminal $\overline{O}$.

Referring to FIGS. 16A and 16B, the circuit block G5, i.e., a selector circuit is formed of p-channel MOS transistors T41, T42, T43, T44, T49, T51 and T52 as well as n-channel MOS transistors T45, T46, T47, T48, T50, T53 and T54. P-channel regions, n-channel regions and gate electrode interconnections of the respective MOS transistors are connected by first interconnections through contact holes, and second interconnections are connected to the first interconnections via through holes. Input terminals A, SA and B as well as an output terminal $\overline{O}$ are provided in the second interconnections.

As described above, in the layout cell of each of the circuit blocks G1–G5, the input terminals and the output terminal(s) are disposed at the upper and lower sides of each layout cell in the figure. Further, as can be seen in FIGS. 13A, 14A, 15A and 16A, each layout cell has the configuration in which the height h is constant and the lateral width is variable. This configuration of the layout cell is determined to meet a demand for easier arrangement of the layout cells and easier interconnections of the layout cells in the layout designing for the LSI.

These layout cells are arranged in accordance with the logical circuit diagram shown in FIG. 8. FIG. 17A shows an arrangement of the layout cells.

These layout cells are arranged in accordance with the logical circuit diagram shown in FIG. 8. FIG. 17A shows an arrangement of the layout cells. The layout cells of the circuit blocks G2, G3 and G4 are disposed in an upper side in the figure, and the layout cells of the circuit blocks G1 and G5 are disposed at the lower side in the figure. A region 1000 between a group of the layout cells disposed at the upper side and a group of the layout cells disposed at the lower side is used for interconnections between the layout cells.

Second interconnections between the layout cells are formed as shown in FIG. 17B. A pattern of the second interconnections has a configuration in which each second interconnection provided with an input terminal or an output terminal of each layout cell extends through the region 1000 between the upper and lower layout groups.

Thereafter, first interconnections between the layout cells are formed, as shown in FIG. 17C. A pattern of the first interconnections is formed such that the pattern of the second interconnections which has been formed as shown in FIG. 17B may be connected to the first interconnections via through holes. The patterns of these first and second interconnections are formed in accordance with the logical circuit diagram shown in FIG. 8 by an automatic arranging and interconnecting program of the CAD system.

Finally, as shown in FIG. 17D, compaction is executed for compacting the interconnection region 1000 between the upper layout cell group and the lower layout cell group. In this manner, the layout design of the LSI is performed by the standard cell method.

Since the layout designing method by the conventional standard cell method is performed as described above, even layout cells located in the same row are interconnected using the interconnection region 1000. Specifically, as shown in FIG. 17D, an interconnection 305 between the layout cells of the circuit blocks G2 and G4 which are located in the same row is disposed using the interconnection region 1000 between the upper layout cell group and the lower layout cell group. The interconnection region 1000 is also used by an interconnection 309 between the layout cells of the circuit blocks G2 and G3 which are located in the upper layout cell group. This increases lengths of the interconnections, and thus reduces an operation speed of the LSI thus designed.

SUMMARY OF THE INVENTION

Accordingly, it is an objection of the invention to achieve efficient interconnections in a layout design of a semiconductor integrated circuit device.

Another object of the invention is to reduce an occupied plane area in a layout design of a semiconductor integrated circuit device.

Still another object of the invention is to design a semiconductor integrated circuit device having an increased operation speed.

Yet another object of the invention is to eliminate excessive interconnections between transistors in a layout design of an LSI by a CMOS standard cell method.

A layout design method for a semiconductor integrated circuit device according to the invention is intended to design a layout of the semiconductor integrated circuit device having predetermined logical functions, using standard layout patterns, which have been previously designed for logical function units, respectively. According to the layout designing method of the invention, a predetermined logical circuit diagram is first divided into a plurality of logical function units. Standard layout patterns corresponding to the respective logical function units are taken out from a predetermined library such that each of layout patterns is divided into a layout pattern of a first conductivity type and a layout pattern of a second conductivity type. The layout patterns of the first conductivity type are arranged in accordance with the logical circuit diagram. The layout patterns of the second conductivity type are arranged in accordance with the logical circuit diagram. Interconnection patterns for interconnecting the layout patterns are arranged in accordance with the logical circuit diagram.

In this invention, the standard layout patterns respectively corresponding to the logical function units are divided into the layout patterns of the first conductivity type and the layout patterns of the second conductivity type. Therefore, interconnections between layout patterns which are located in the same row can be formed using a region between the layout patterns of the first conductive type and the layout patterns of the second conductive type, without using interconnection regions between layout pattern rows. Therefore, interconnections between the layout patterns located in the same rows can be made short. Consequently, excessive interconnection regions can be minimized, resulting in efficient interconnections. An operation speed of a designed semiconductor integrated circuit device can be increased.

As described above, according to the invention, the layout patterns are arranged, in the standard cell method, in such a fashion that the layout patterns of the first conductivity type and the layout patterns of the second conductivity type are divided. Therefore, the interconnections between the layout patterns can be formed in the region between the layout pattern group of the first conductivity type and the layout pattern group of the second conductivity type. Accordingly, excessive interconnection regions can be minimized, resulting in the efficient interconnections. Accordingly, an occupied plane area in the layout design can be reduced. Further, excessive interconnections between the transistors can be eliminated, and thus an increased operation speed can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a plane layout showing divided p-type and n-type layout cells of a circuit block G1.

FIG. 4A is a plane layout showing divided p-type and n-type layout cells of a circuit block G3 (G4)

FIG. 5A is a plane layout showing divided p-type and n-type layout cells of a circuit block G5.

FIGS. 6A, 6B, 6C, 6D, 6E and 6F are plane layouts showing steps for arranging and interconnecting layout cells in accordance with the flow chart in FIG. 1;

DETAILED DESCRIPTION OF THE PREFERRED EMBODIMENTS

Figure 1:
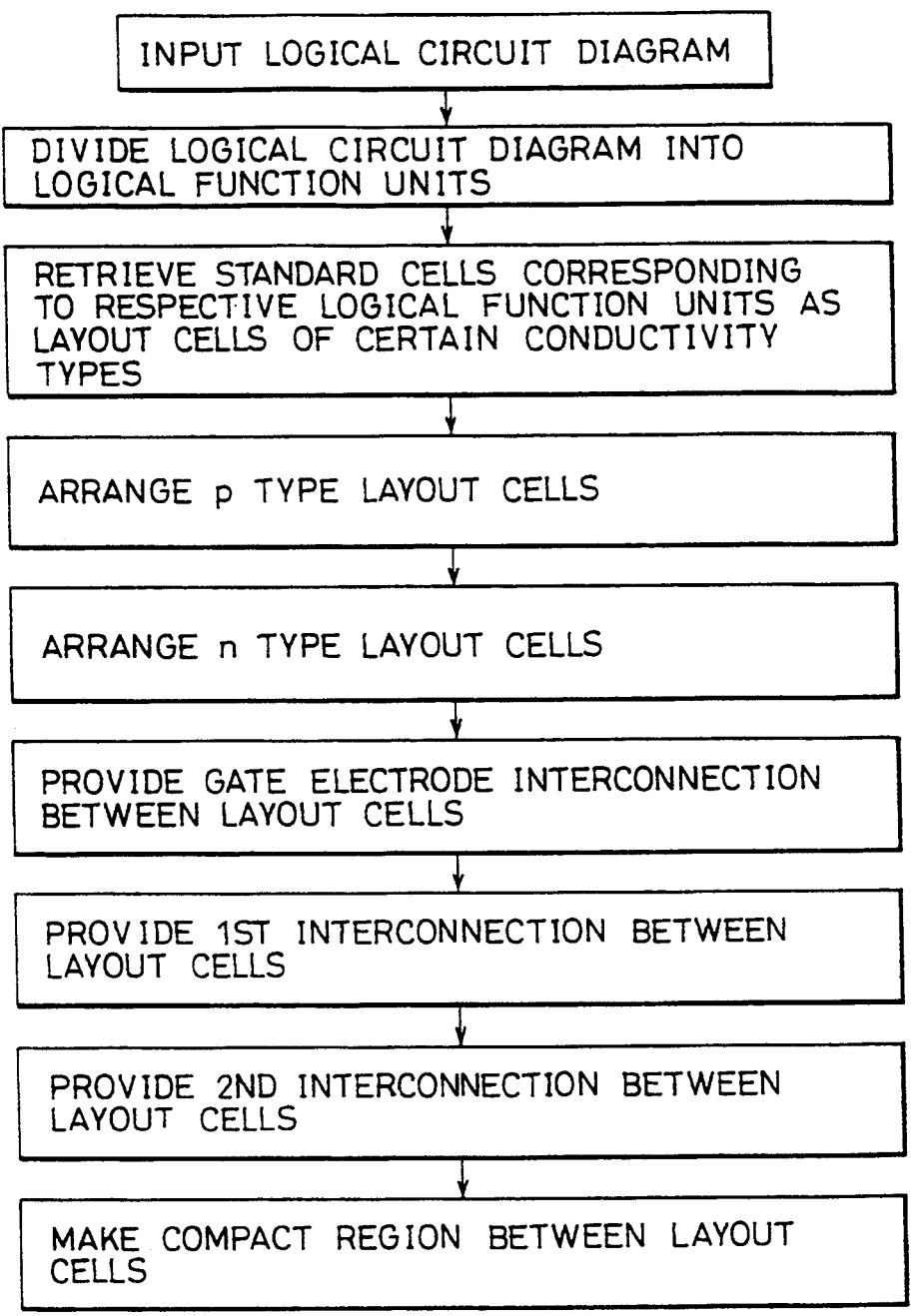
FIG. 1 is a flow chart showing a layout designing method for a semiconductor integrated circuit device according to an embodiment of the invention.
Figure 8:
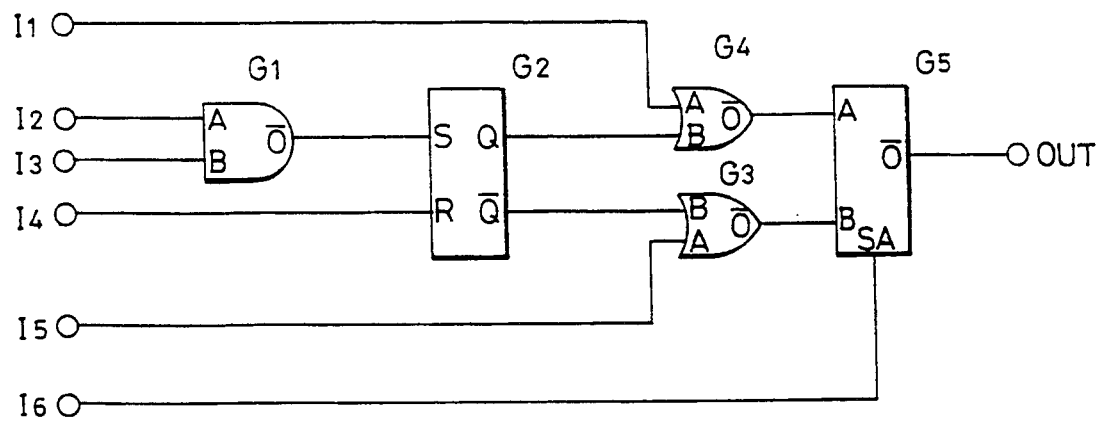
FIG. 8 is a logical circuit diagram which is used as a design target in an example of the prior art and an embodiment of the invention.
Figure 9:
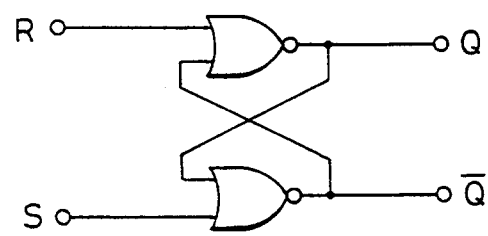
FIG. 9 is an internal logical circuit diagram showing a circuit block G2 in FIG. 8.
Figure 10:
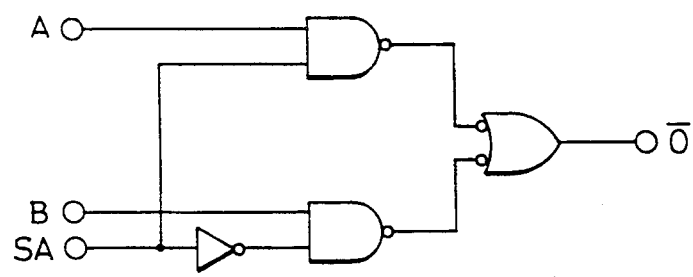
FIG. 10 is an internal logical circuit diagram showing a circuit block G5 in FIG. 8.
Figure 11:
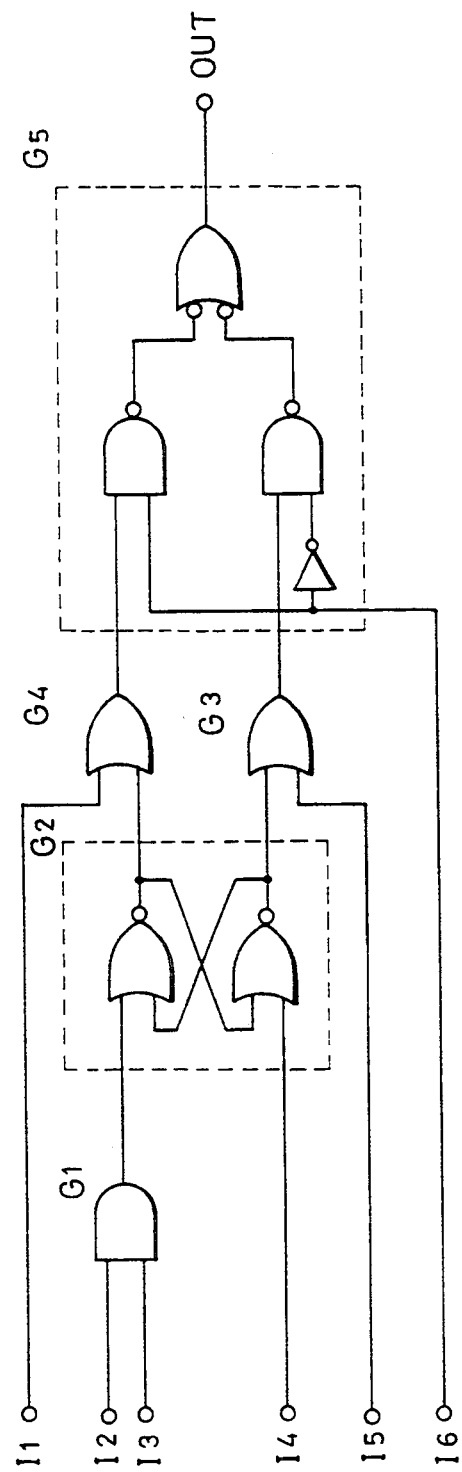
FIG. 11 is a circuit diagram showing a logical circuit diagram in FIG. 8 at a logic gate level.
Figure 12:
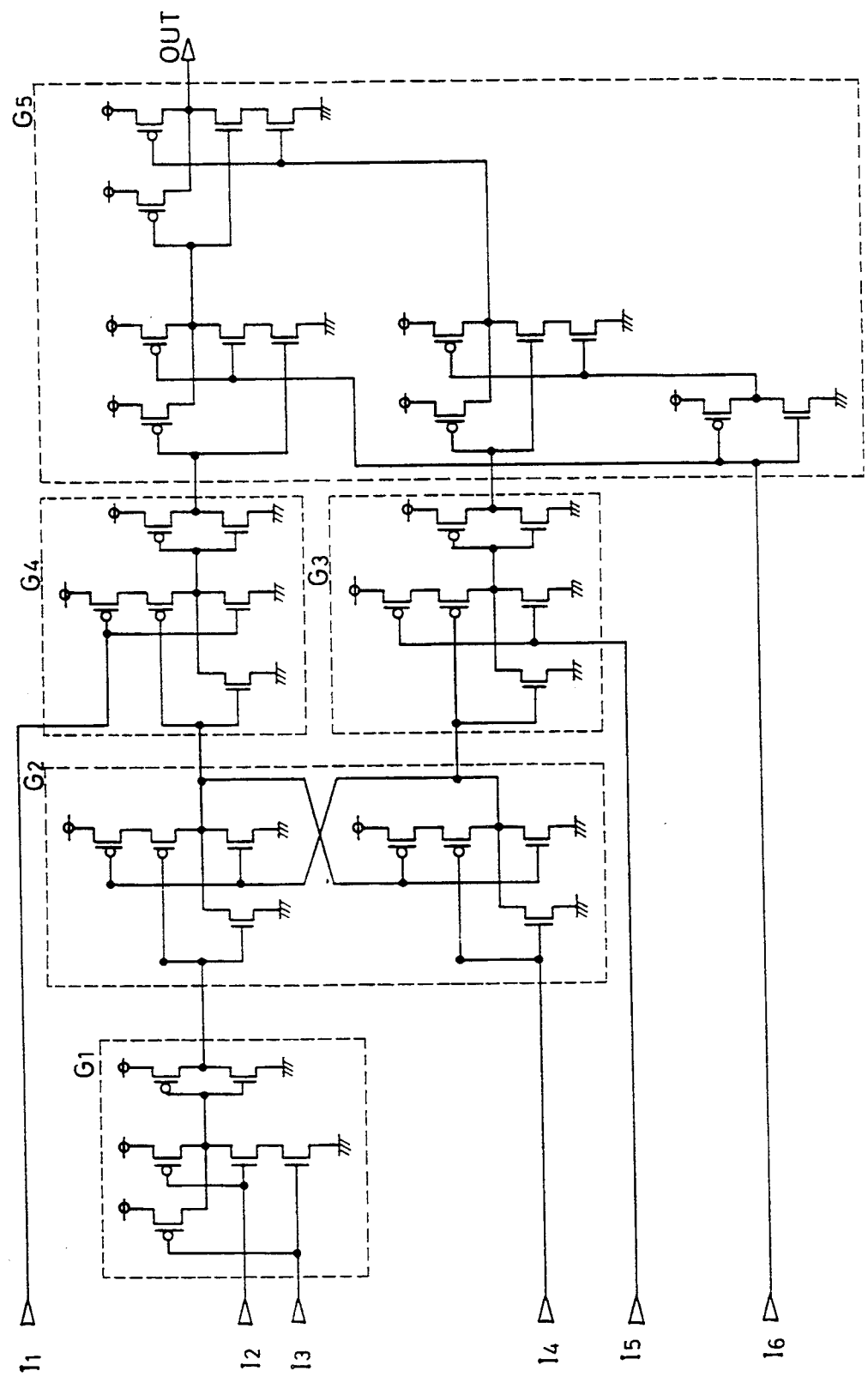
FIG. 12 is a circuit diagram showing a logical circuit diagram in FIG. 8 at a transistor level.
Figure 13A:
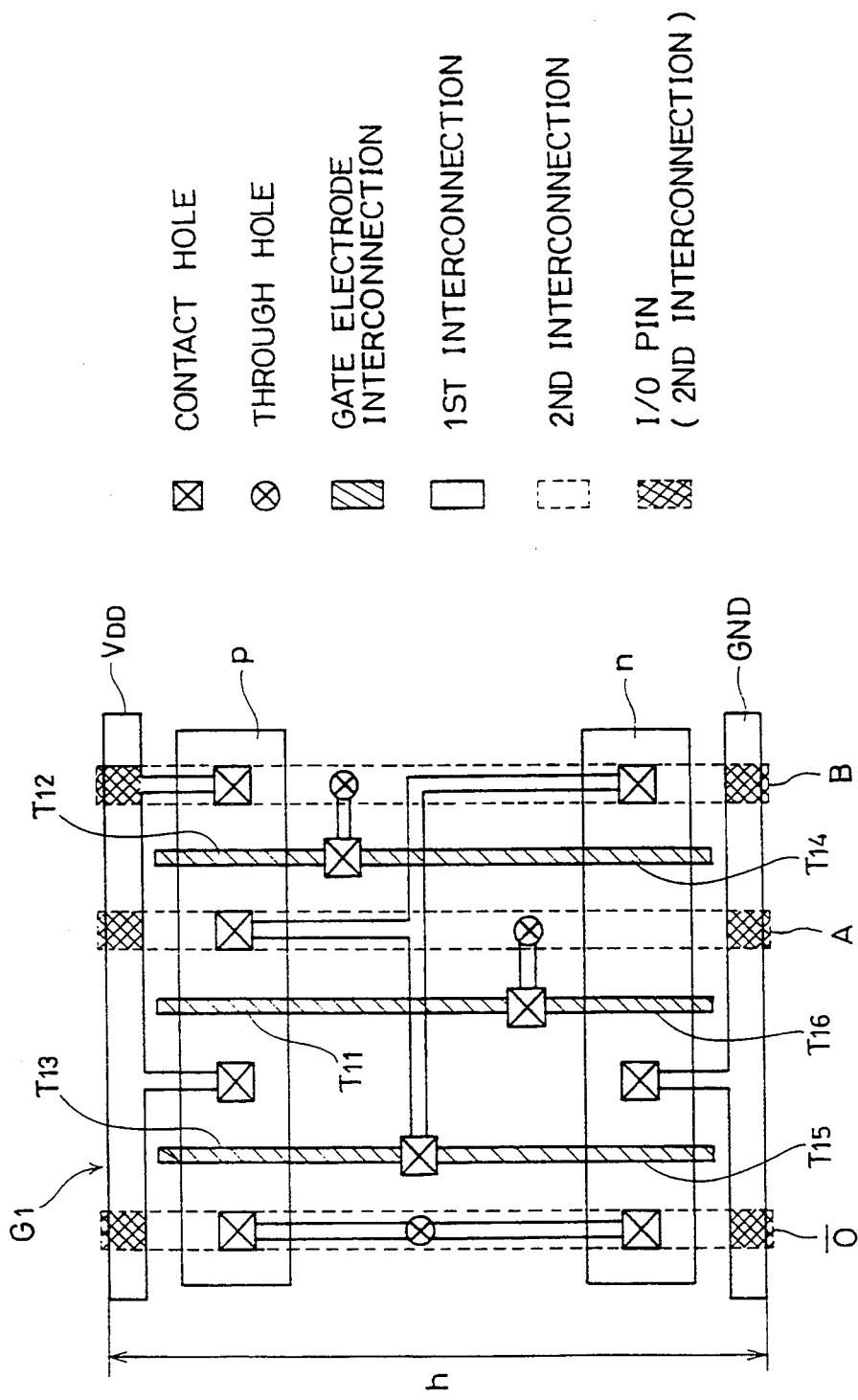
FIG. 13A is a plane layout showing a layout cell of a circuit block G1 used in a conventional standard cell method.
Figure 13B:
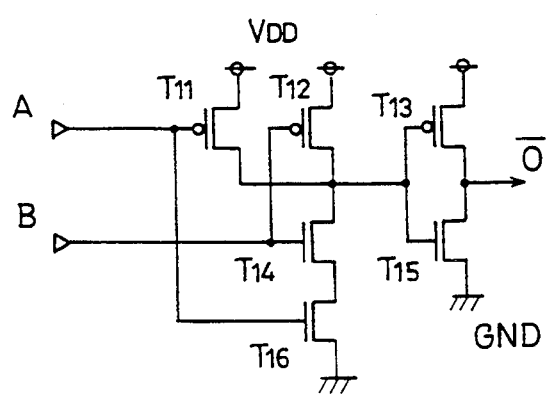
FIG. 13B is an equivalent circuit diagram corresponding to the layout cell in FIG. 13A.
Figure 14A:
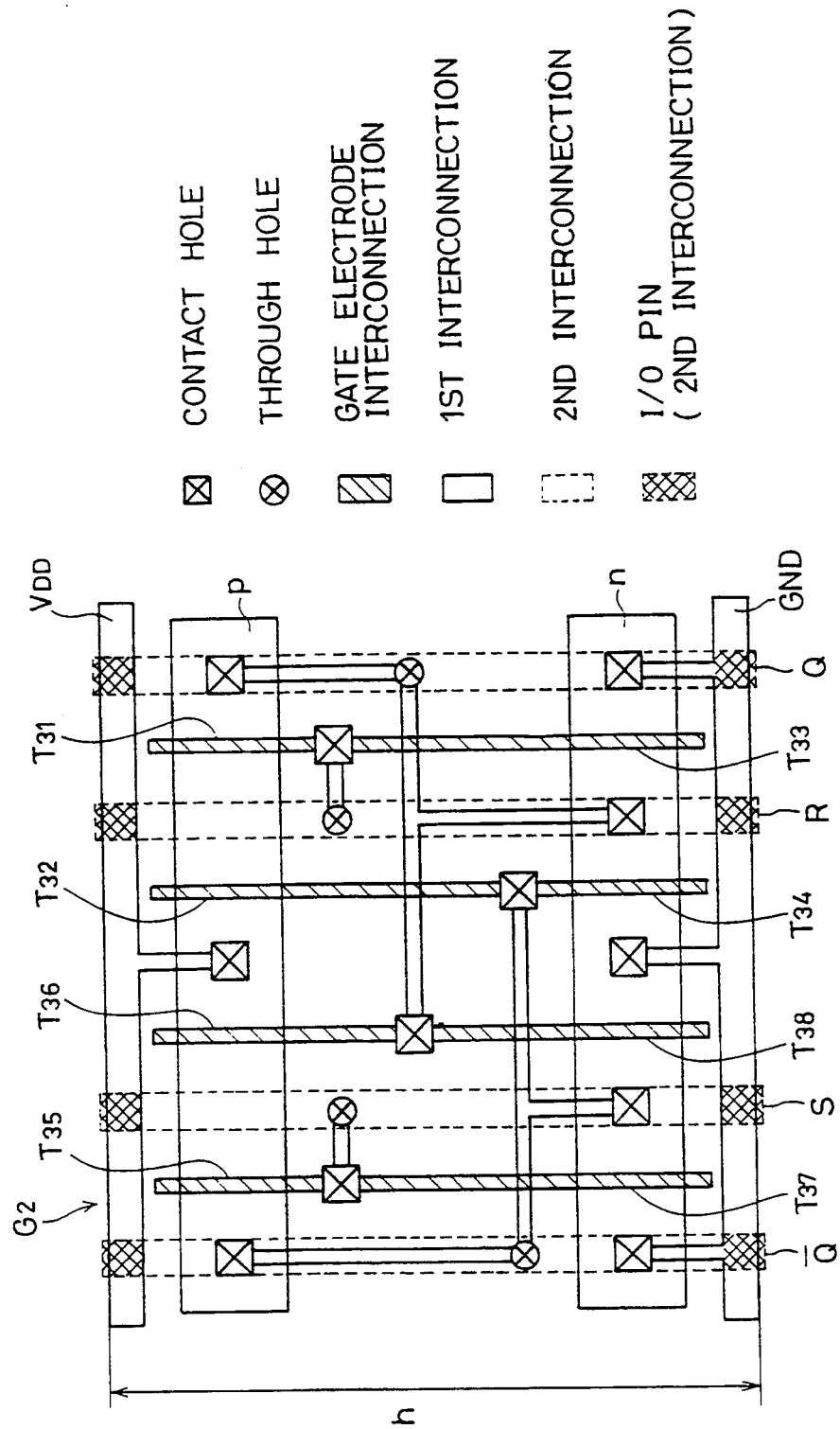
FIG. 14A is a plane layout showing a layout cell of a circuit block G2 used in a conventional standard cell method.
Figure 14B:
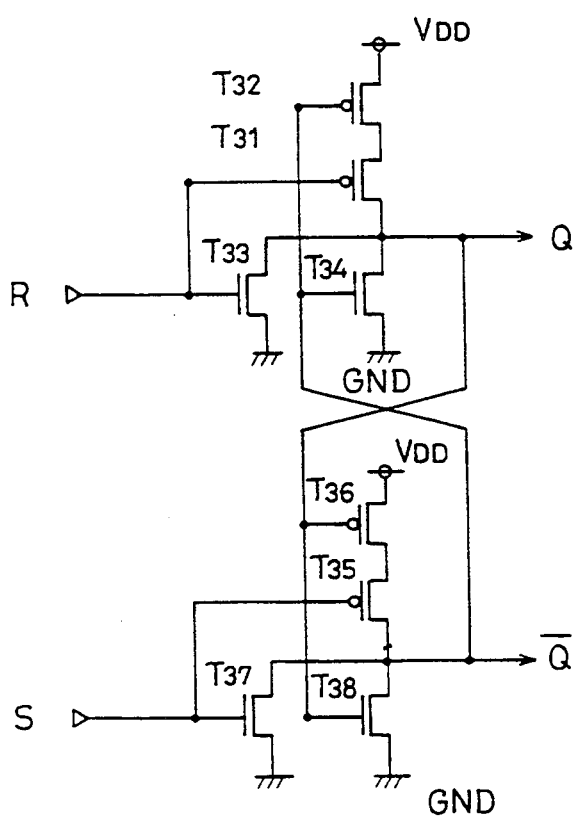
FIG. 14B is an equivalent circuit diagram corresponding to the layout cell in FIG. 14A.
Figure 15A:
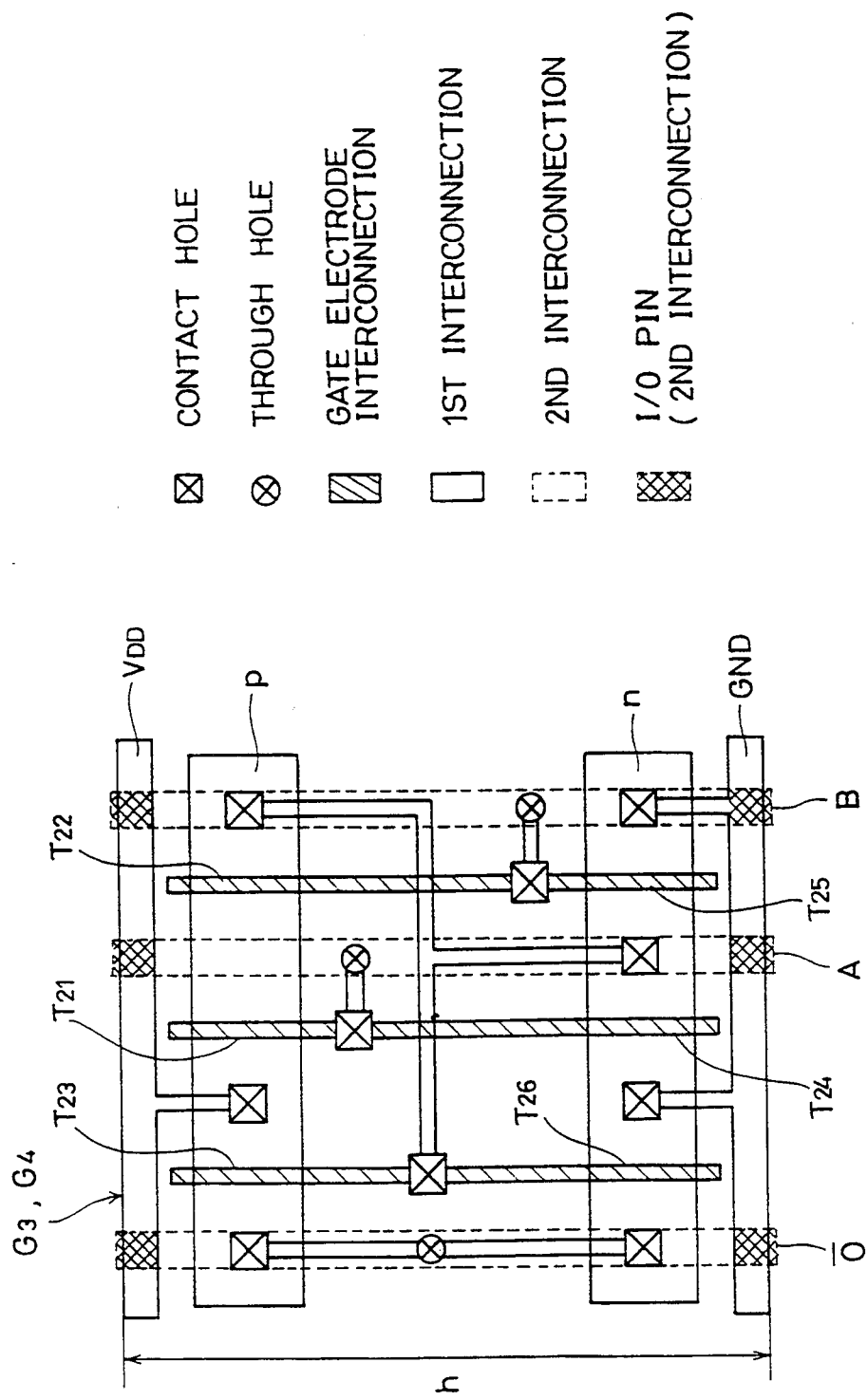
FIG. 15A is a plane layout showing a layout cell of a circuit block G3 (G4) used in a conventional standard cell method.
Figure 15B:
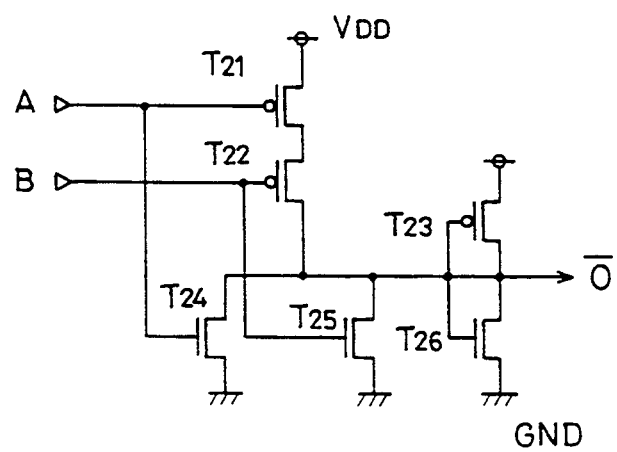
FIG. 15B is an equivalent circuit diagram corresponding to the layout cell in FIG. 15A.
Figure 16A:
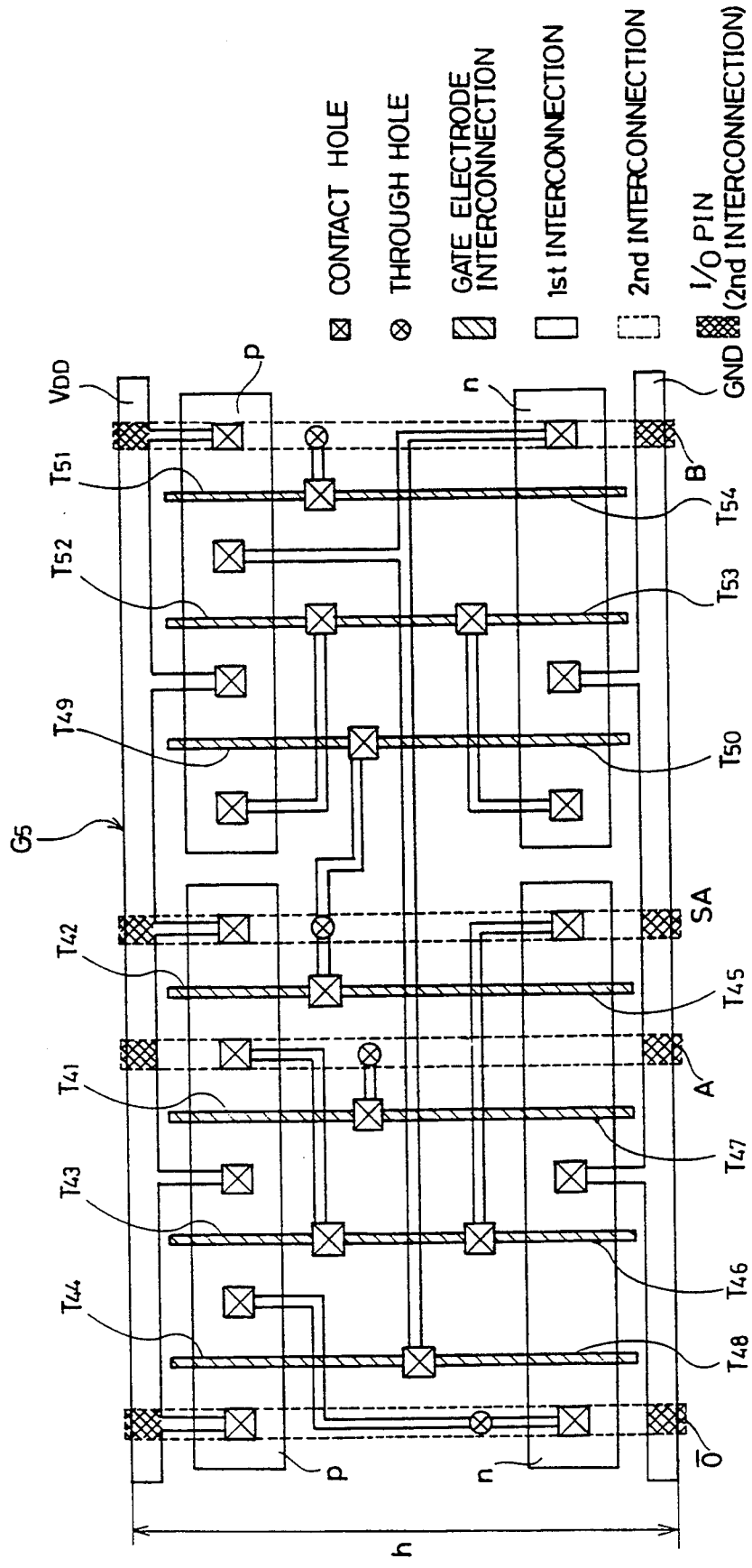
FIG. 16 is a plane layout showing a layout cell of a circuit block G5 used in a conventional standard cell method.
FIG. 16B is an equivalent circuit diagram corresponding to the layout cell in FIG. 16A.
Figure 16B:
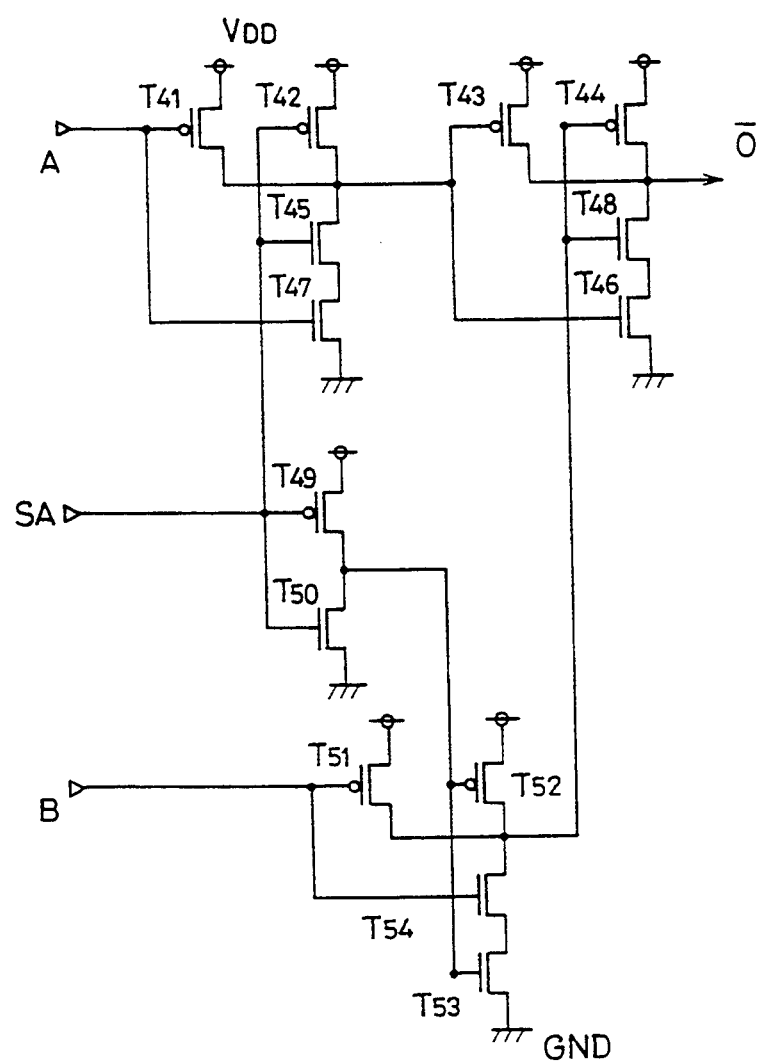

Referring to FIG. 1A, a predetermined logical circuit diagram as a design target is entered in a CAD system. In this embodiment, a logical circuit diagram shown in FIG. 8 is entered as an example. Then, this logical circuit diagram is divided into logical function units, i.e., circuit blocks G1–G5. The standard cells corresponding to the respective logical function units are selected from a library as layout cells classified in accordance with conductivity types. In other words, standard layout patterns respectively corresponding to the circuit blocks G1–G5 are selected from the library as the patterns which are divided into p-type layout cells and n-type layout cells.

Figure 2B:
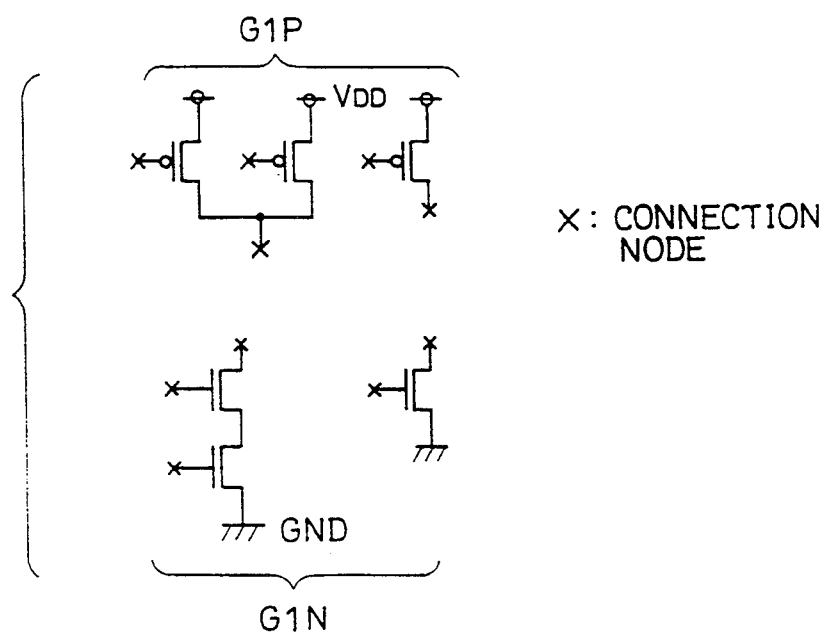
FIG. 2B is an equivalent circuit diagram corresponding to these layout cells.

FIG. 2A shows layout cells which correspond to the circuit block G1 and are divided in accordance with the conductivity types. The standard layout pattern corresponding to the circuit block G1 is divided into a layout cell G1P of p-type and a layout cell G1N of n-type. FIG. 2B shows an equivalent circuit diagram corresponding to these layout cells G1P and G1N. The p-type layout cell G1P includes three p-channel MOS transistors. A layout pattern of these p-channel MOS transistors includes four p-type impurity region patterns 10p and three gate electrode patterns. The p-type impurity region patterns 10p are aligned and spaced in a lateral direction in the figure, and have predetermined widths, respectively. The gate electrode patterns are located between the p-type impurity region patterns and are laterally spaced from each other. The n-type layout cell G1N includes a layout pattern of laterally aligned three n-channel MOS transistors. Similarly to the layout pattern of the p-channel MOS transistors, the layout pattern of these n-channel MOS transistors includes four n-type impurity region patterns 10n and three gate electrode patterns. The p-type layout cell G1P and the n-type layout cell G1N include a power supply interconnection $V_{DD}$ connected to the p-type impurity region patterns 10p and a ground interconnection GND connected to the n-type impurity region patterns 10n, respectively. The power supply interconnection $V_{DD}$ and the ground interconnection GND extend along the aligned p-type region patterns 10p and the aligned n-type impurity region patterns 10n. In this manner, the layout cells corresponding to the circuit block G1 are divided into the p-type layout cell G1P and the n-type layout cell G1N.

Figure 3A:
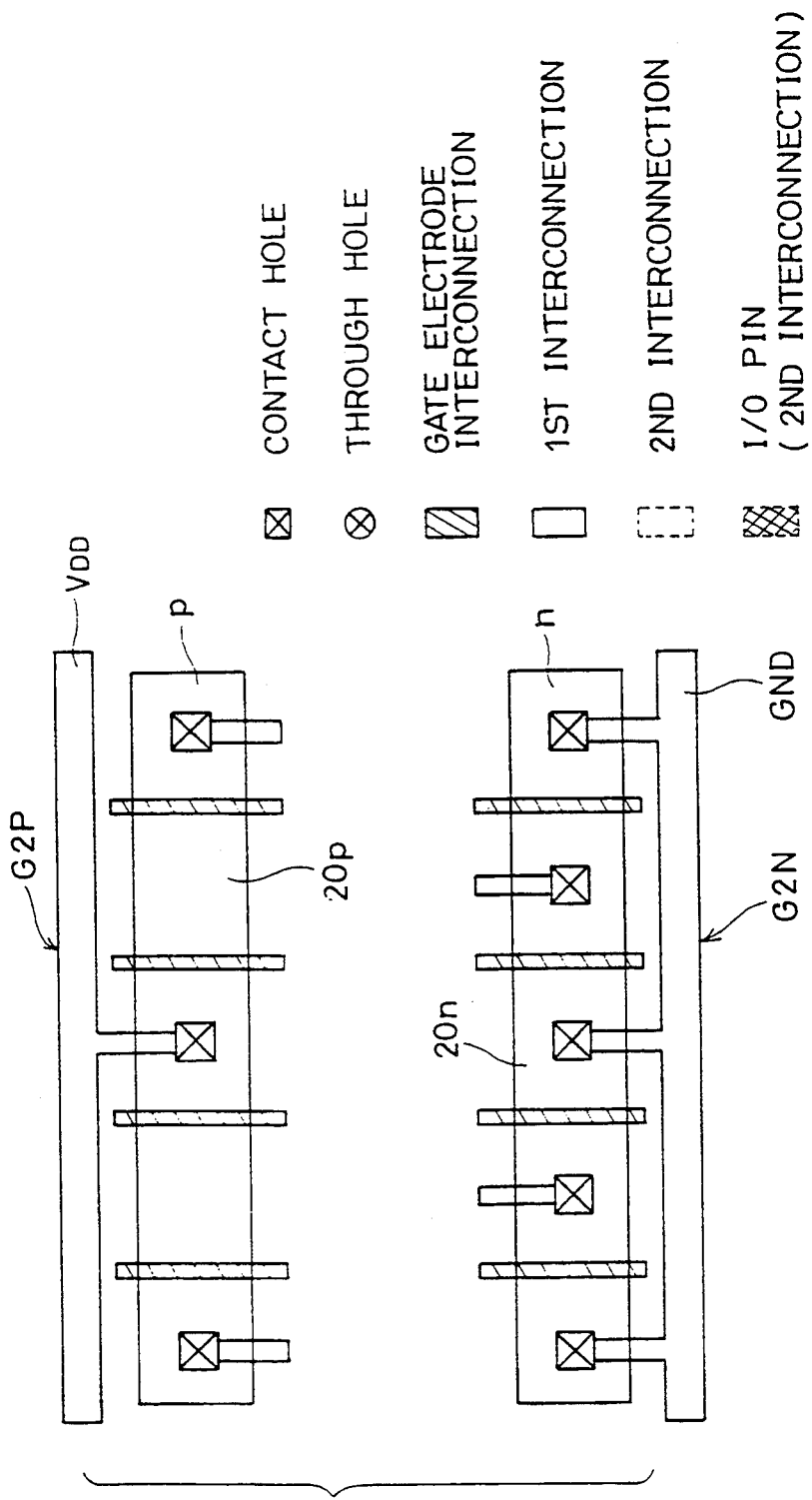
FIG. 3A is a plane layout showing divided p-type and n-type layout cells of a circuit block G2.
Figure 3B:
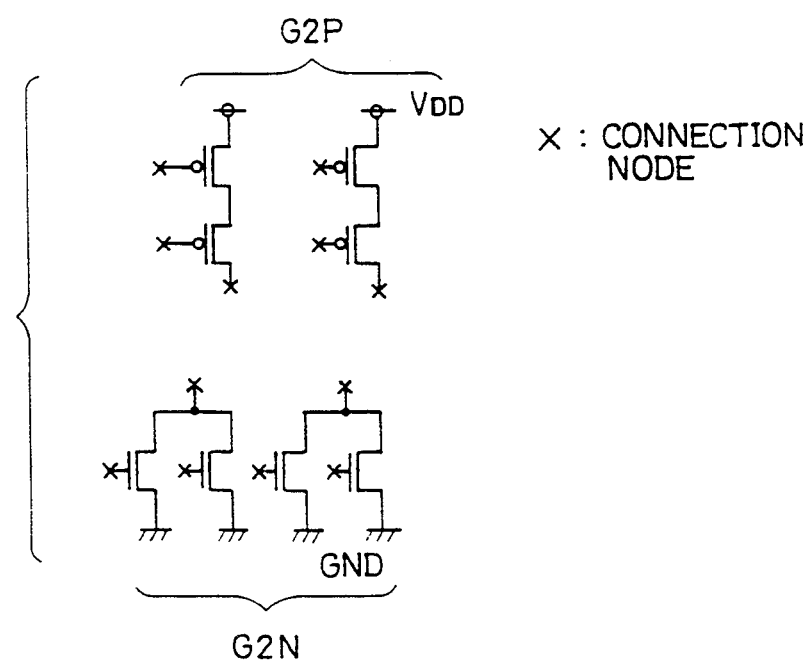
FIG. 3B is an equivalent circuit diagram corresponding to these layout cells.

FIG. 3A shows layout cells of the circuit block G2 which are divided into a p-type layout cell G2P and an n-type layout cell G2N. FIG. 3B shows an equivalent circuit diagram corresponding to the p-type layout cell G2P and the n-type layout cell G2N. Similarly to the layout cells shown in FIG. 2A, the p-type layout cell G2P includes a layout pattern of p-channel MOS transistors. The n-type layout cell G2N also includes a layout pattern of n-channel MOS transistors. The layout patterns of the p-channel MOS transistors and the n-channel MOS transistors include p-type impurity region patterns 20p and n-type impurity regions 20n, respectively.

Figure 4B:
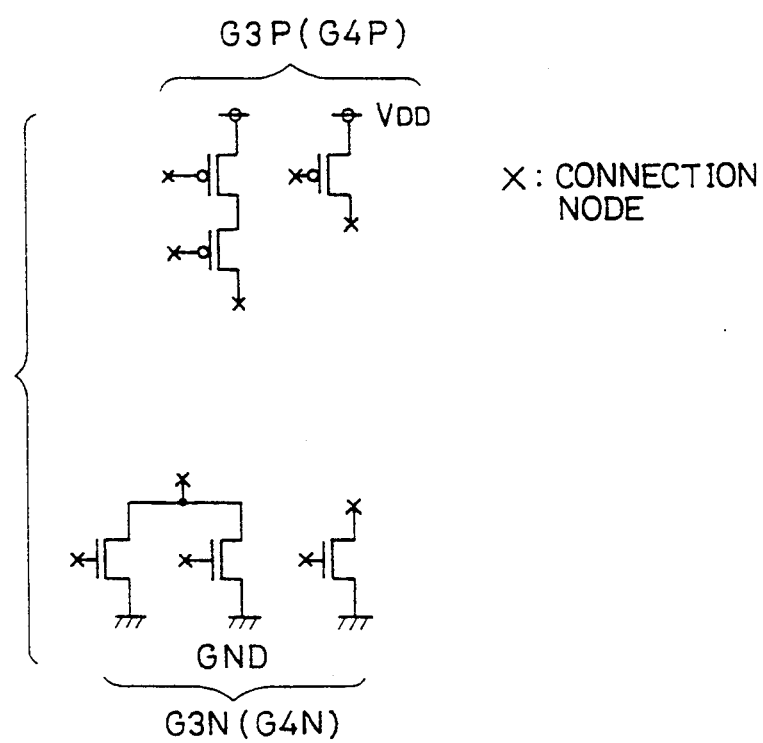
FIG. 4B is an equivalent circuit diagram corresponding to these layout cells.

FIG. 4A shows layout cells of the circuit block G3 (G4) which are divided into a p-type layout cell G3P (G4P) and an n-type layout cell G3N (G4N). FIG. 4B shows an equivalent circuit diagram corresponding to the p-type layout cell G3P (G4P) and the n-type layout cell G3N (G4N). Similarly to the layout cells shown in FIG. 2A, the p-type layout cell G3P (G4P) and the n-type layout cell G3N (G4N) include layout patterns of a plurality of p-channel MOS transistors and n-channel MOS transistors, respectively. The layout patterns of the p-channel MOS transistors and the n-channel MOS transistors include p-type impurity region patterns 30p (40p) and n-type impurity region patterns 30n (40n), respectively.

Figure 5B:
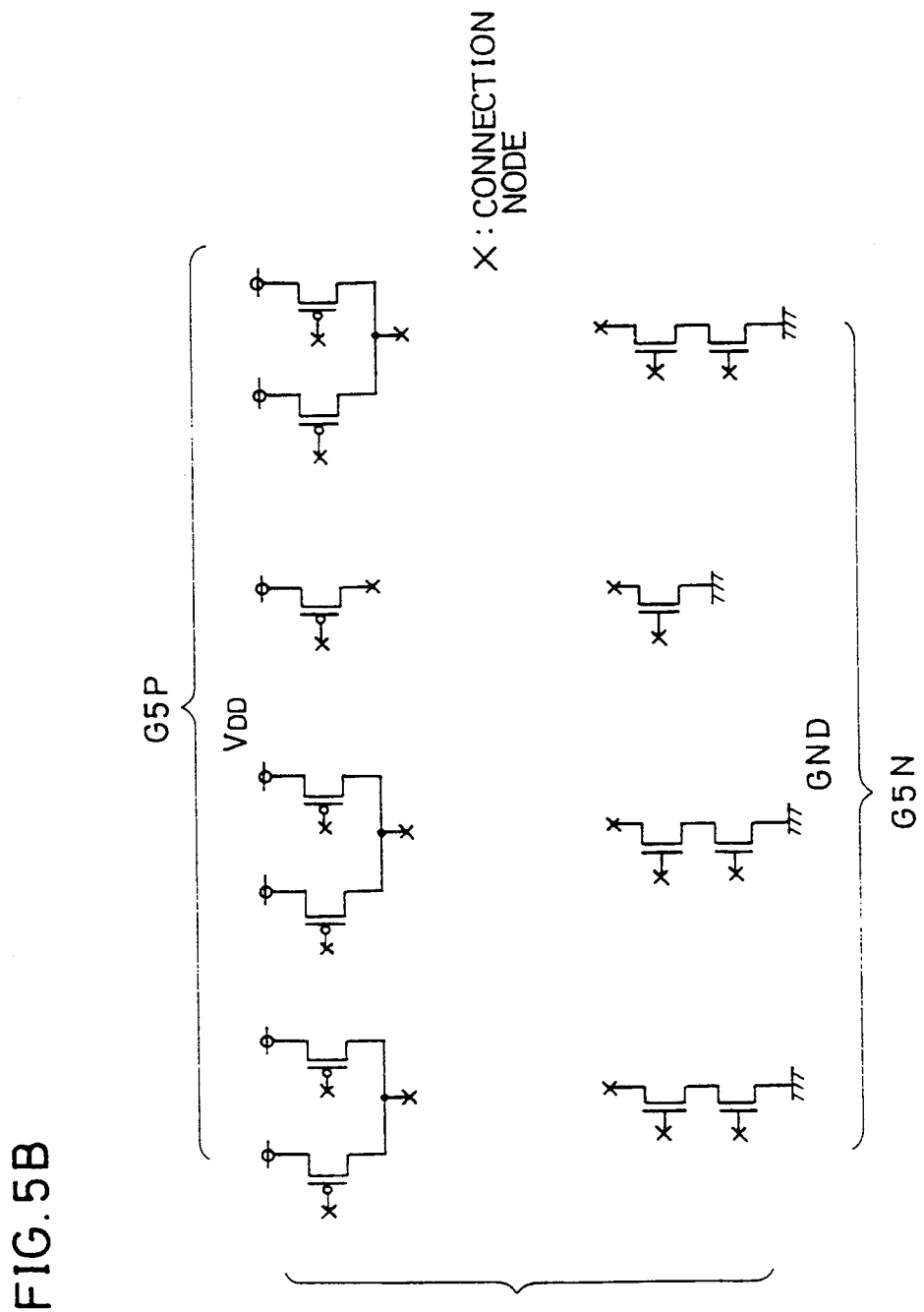
FIG. 5B is an equivalent circuit diagram corresponding to these layout cells.

FIG. 5A shows layout cells which correspond to the circuit block G5 and are divided into a p-type layout cell G5P and an n-type layout cell G5N. FIG. 5B shows an equivalent circuit diagram corresponding to the p-type layout cell G5P and the n-type layout cell G5N. Similarly to the layout cell shown in FIG. 2A, the p-type layout cell G5P and the n-type layout cell G5N include a layout pattern of a plurality of p-channel MOS transistors and a layout pattern of a plurality of n-channel MOS transistors, respectively. The layout pattern of the p-channel MOS transistors and the layout pattern of the n-channel MOS transistors include a plurality of p-type impurity region patterns 51p and 52p and a plurality of n-type impurity region patterns 51n and 52n, respectively.

As described above, the layout cells respectively corresponding to the circuit blocks G1–G5 are divided into the p-type layout cells and the n-type layout cells and are selected from the library.

Figure 6A:
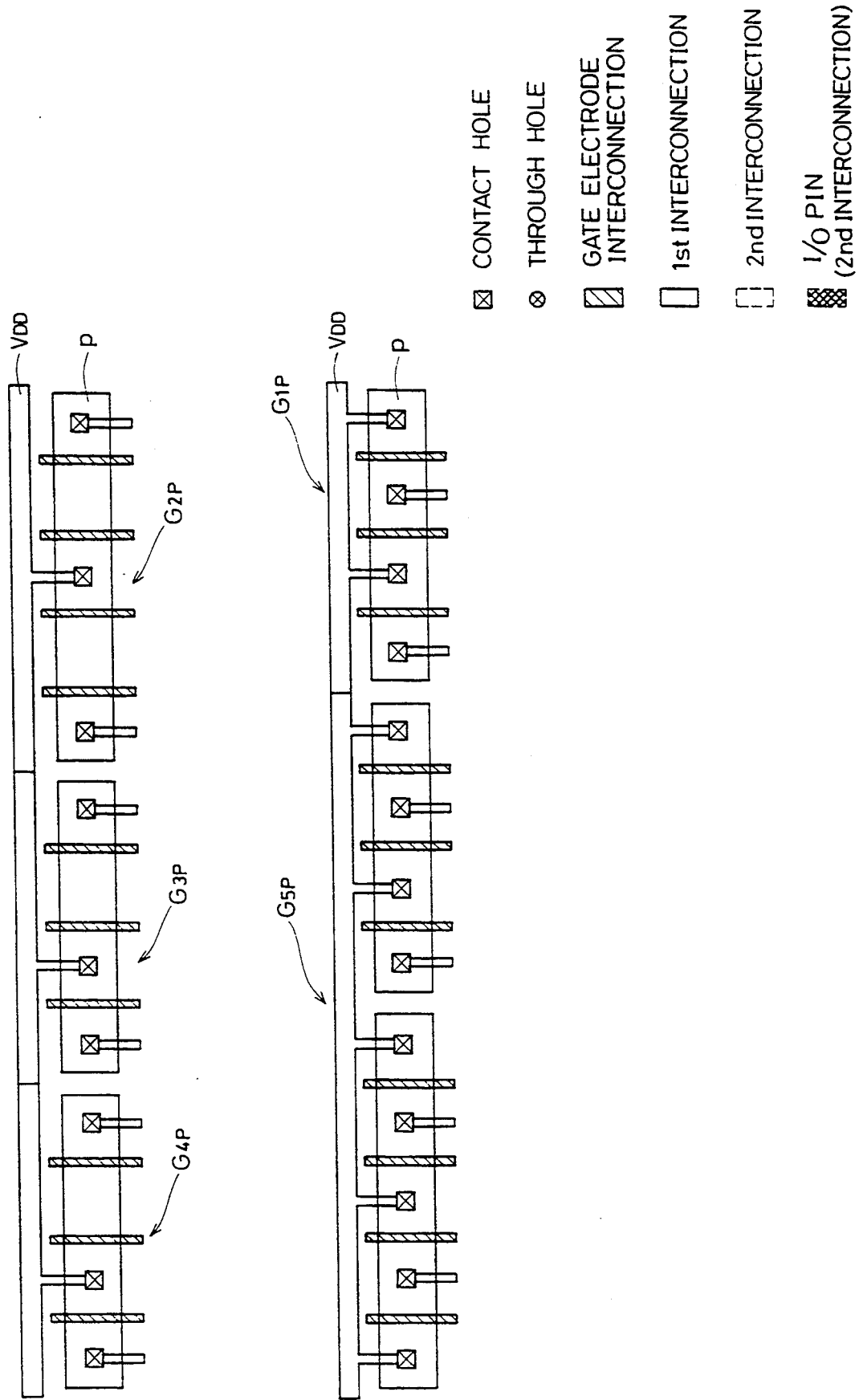

Referring to FIG. 6A, the p-type layout cells G2P, G3P and G4P are arranged in the upper region and the p-type layout cells G1P and G5P are arranged in the lower region. Then, referring to FIG. 6B, the n-type layout cells G2N, G3N and G4N are arranged in the upper regions and are opposed to the p-type layout cells G2P, G3P and G4P, respectively. Also, the n-type layout cells G1N and G5N are arranged in the lower region and are opposed to the p-type layout cells G1P and G5P, respectively.

Figure 6C:
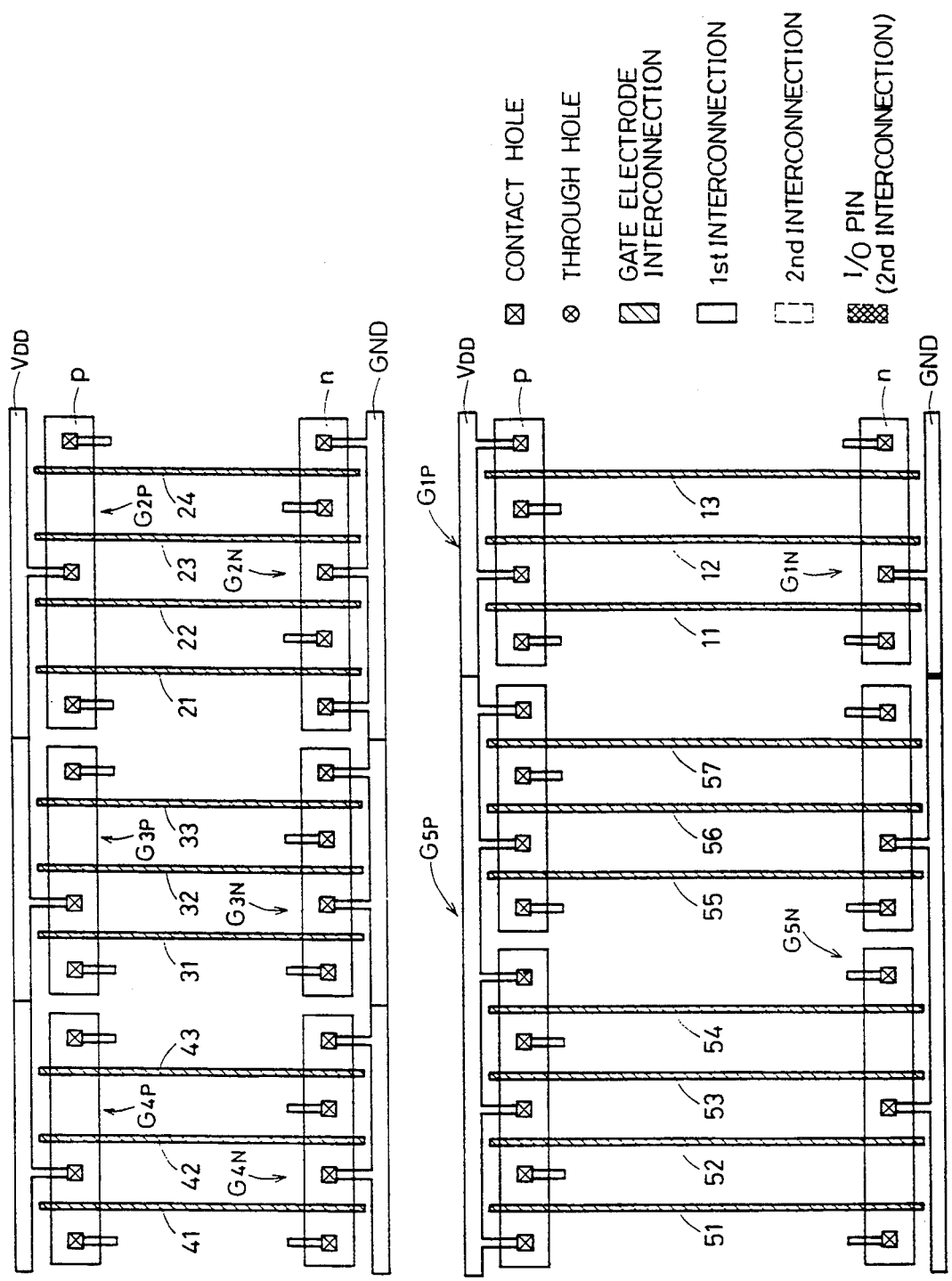

Thereafter, as shown in FIG. 6C, the gate electrode interconnections are formed between the layout cells. Specifically, gate electrode interconnections 21, 22, 23 and 24 are formed between the p-type layout cell G2P and the n-type layout cell G2N. Gate electrode interconnections 31, 32 and 33 are formed between the p-type layout cell G3P and the n-type layout cell G3N. Gate electrode interconnections 41, 42 and 43 are formed between the p-type layout cell G4P and the n-type layout cell G4N. Gate electrode interconnections 11, 12 and 13 are formed between the p-type layout cell G1P and the n-type layout cell G1N. Gate electrode interconnections 51, 52, 53, 54, 55, 56 and 57 are formed between the p-type layout cell G5P and the n-type layout cell G5N.

Figure 6D:
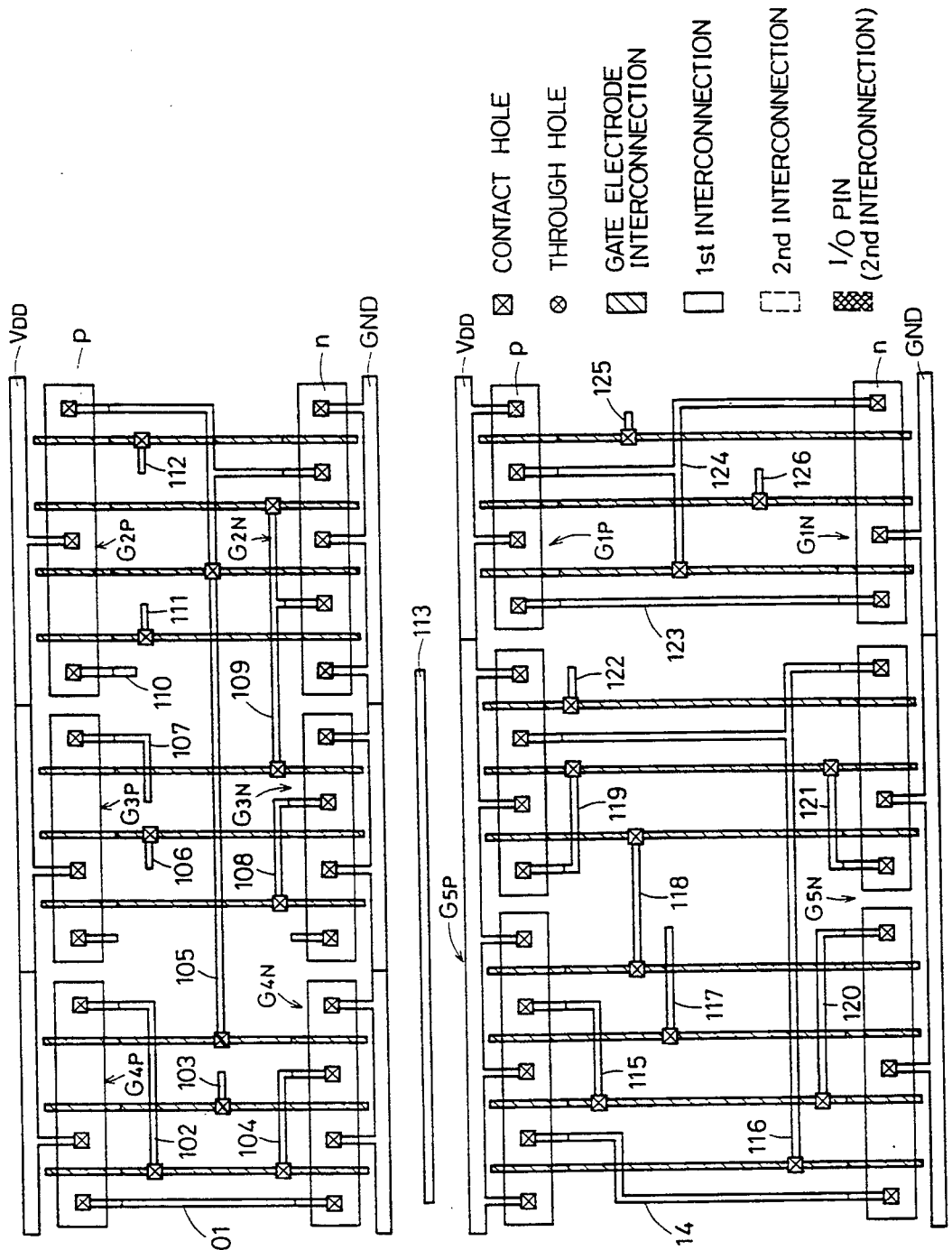

Referring to FIG. 6D, first interconnections 101–126 between the layout cells are formed by the automatic arranging and interconnecting program in accordance with the logical circuit diagram shown in FIG. 8 which is entered in the CAD system.

Figure 6E:
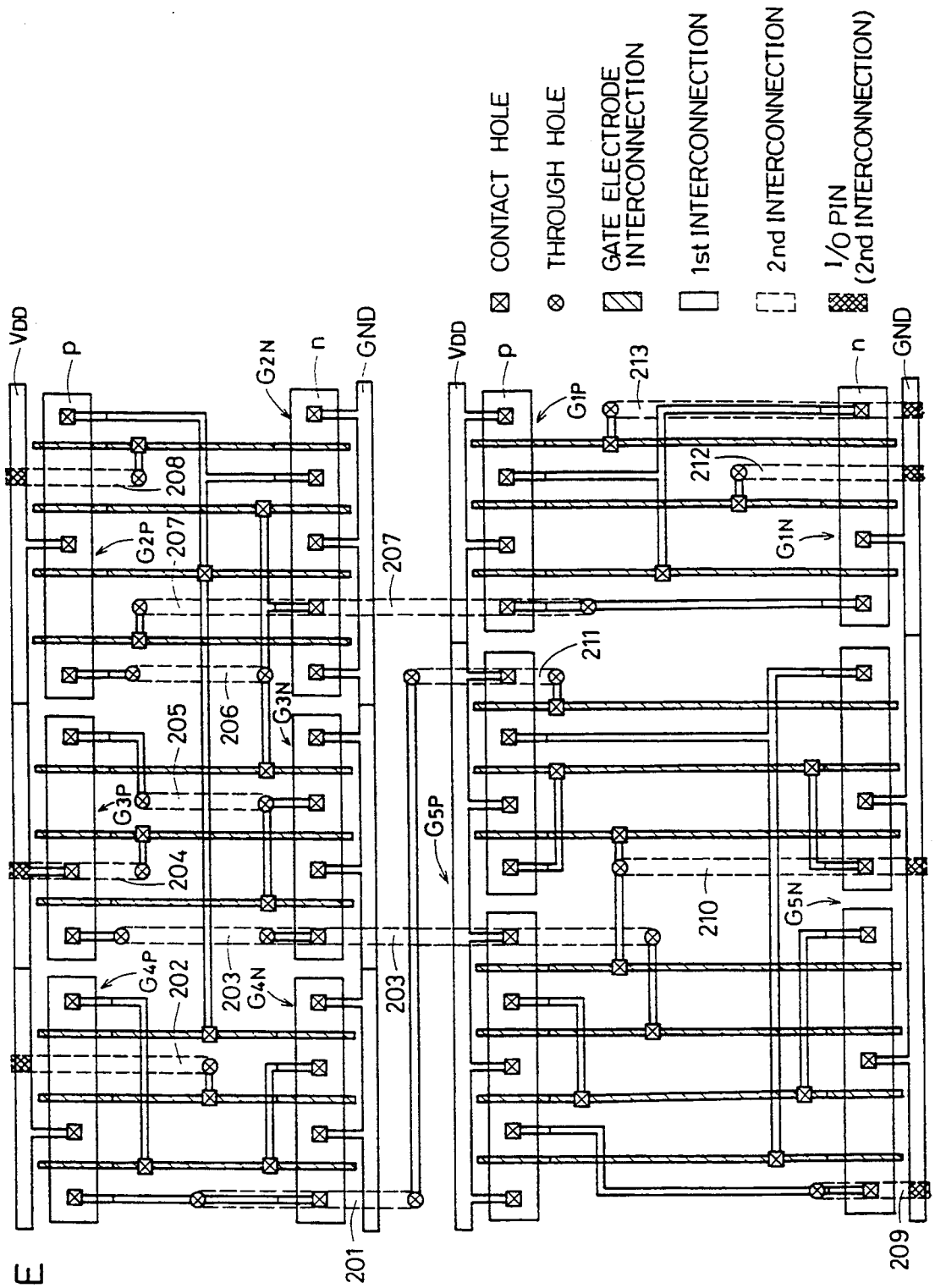

Further, as shown in FIG. 6E, second interconnections 201–213 are formed at the upper layer for interconnecting the first interconnections by the automatic arranging and interconnecting program of the CAD system in accordance with the logical circuit diagram in FIG. 8.

Figure 6F:
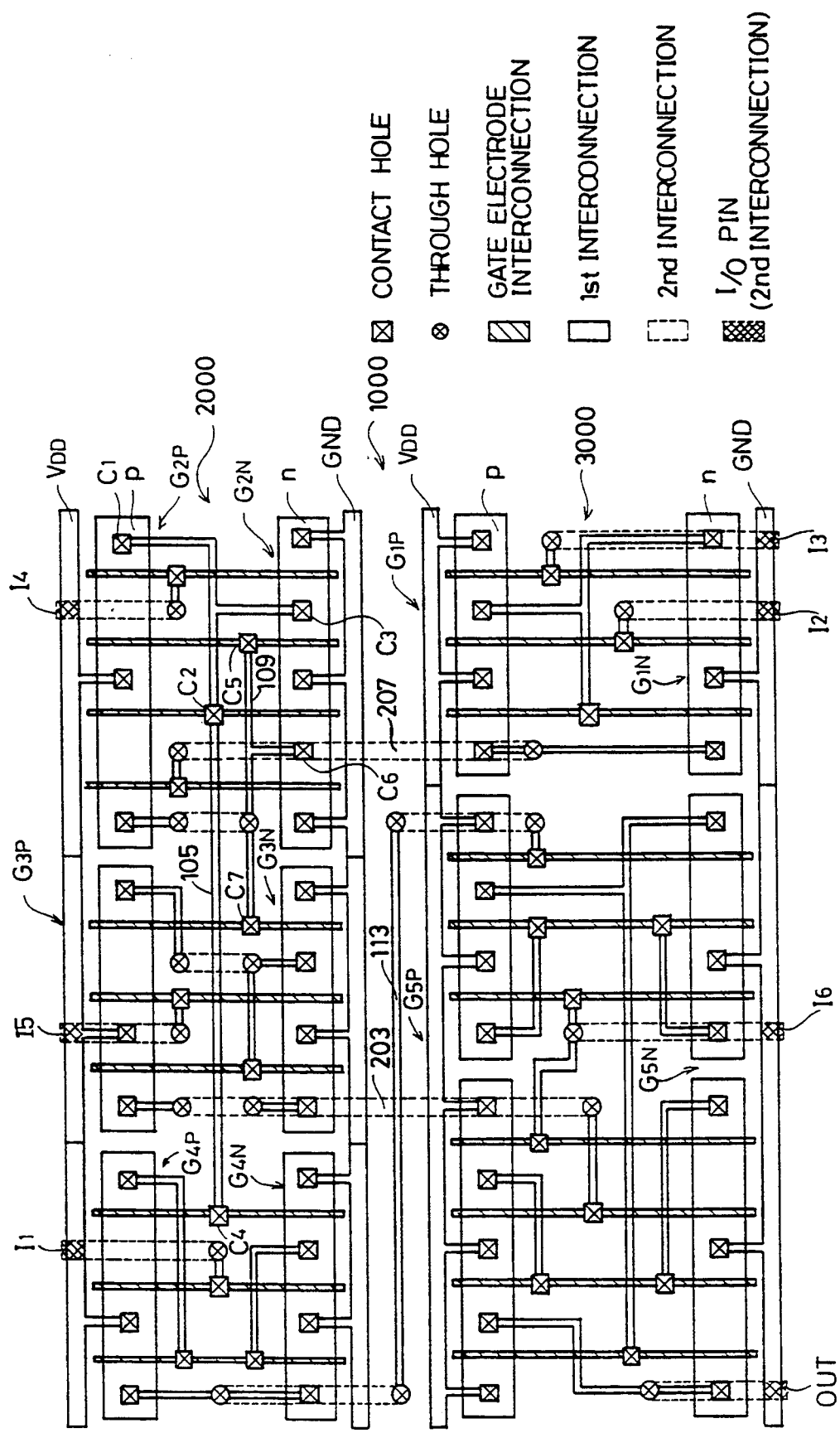
Figure 7:
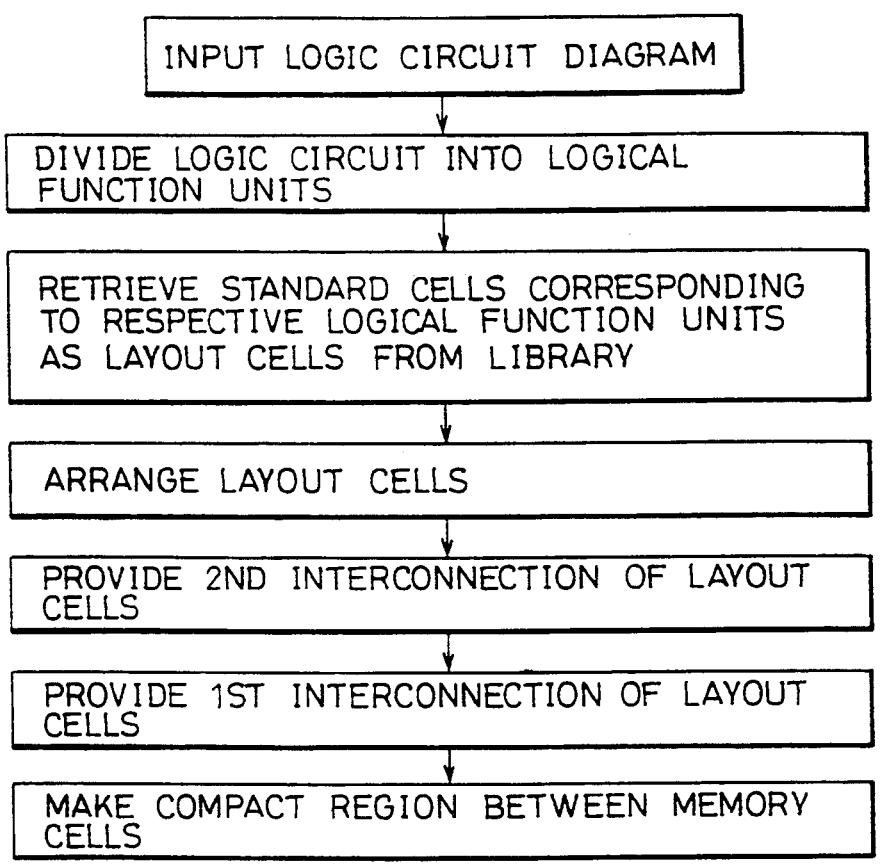
FIG. 7 is a flow chart showing a layout designing method for a semiconductor integrated circuit device in the prior art.

Finally, as shown in FIG. 6F, compaction processing is executed for compacting the interconnection region 1000 between the upper layout cell group and the lower layout cell group as well as interconnection regions 2000 and 3000 between the p-type layout cell group and the n-type layout cell group. In this manner, the layout designing of the LSI is performed by the standard cell method in accordance with the invention.

Figure 17A:
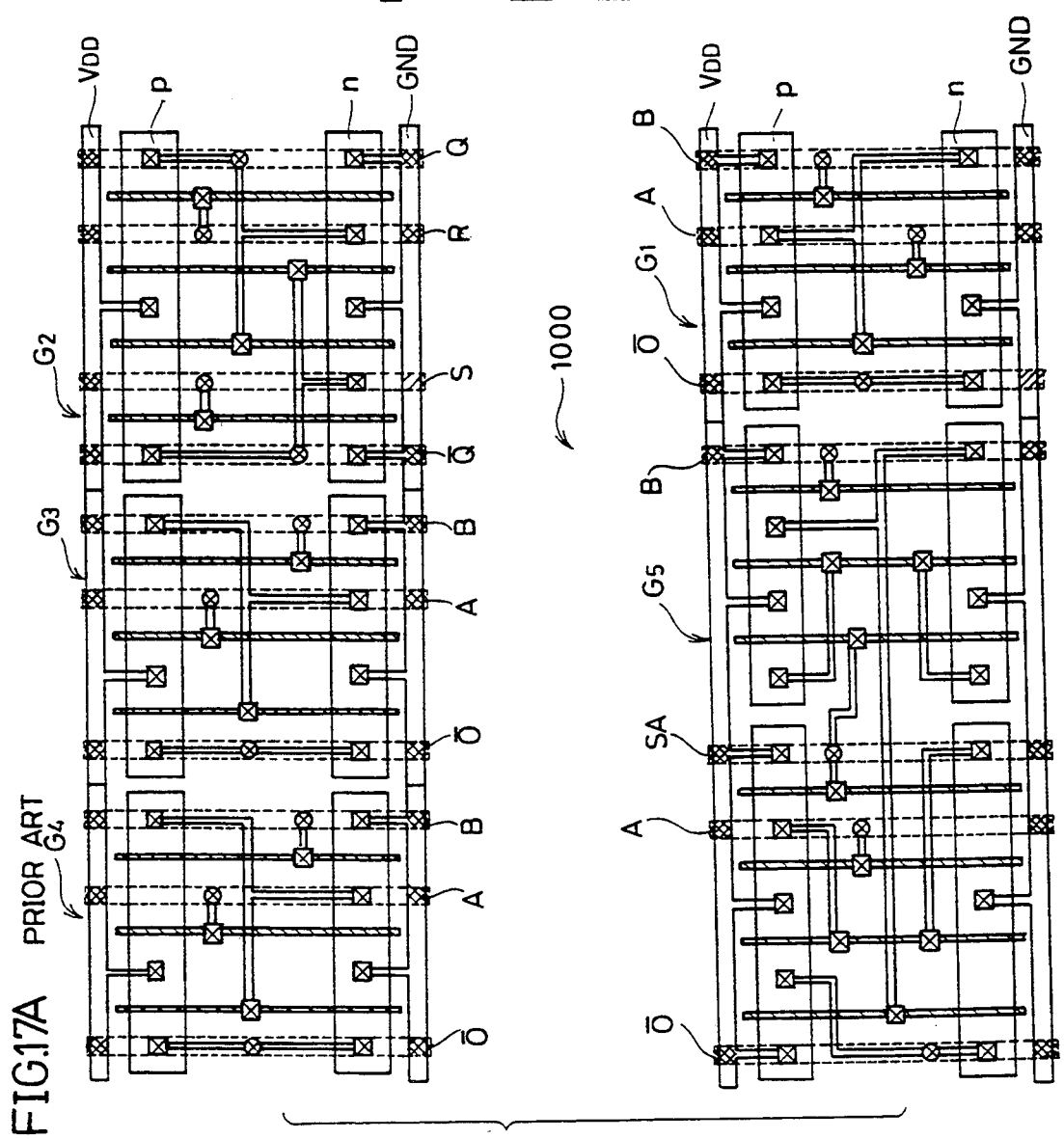
FIGS. 17A, 17B, 17C and 17D are plane layouts showing steps of arranging layout cells and steps of interconnecting layout cells in accordance with a sequence shown in FIG. 7.
Figure 17B:
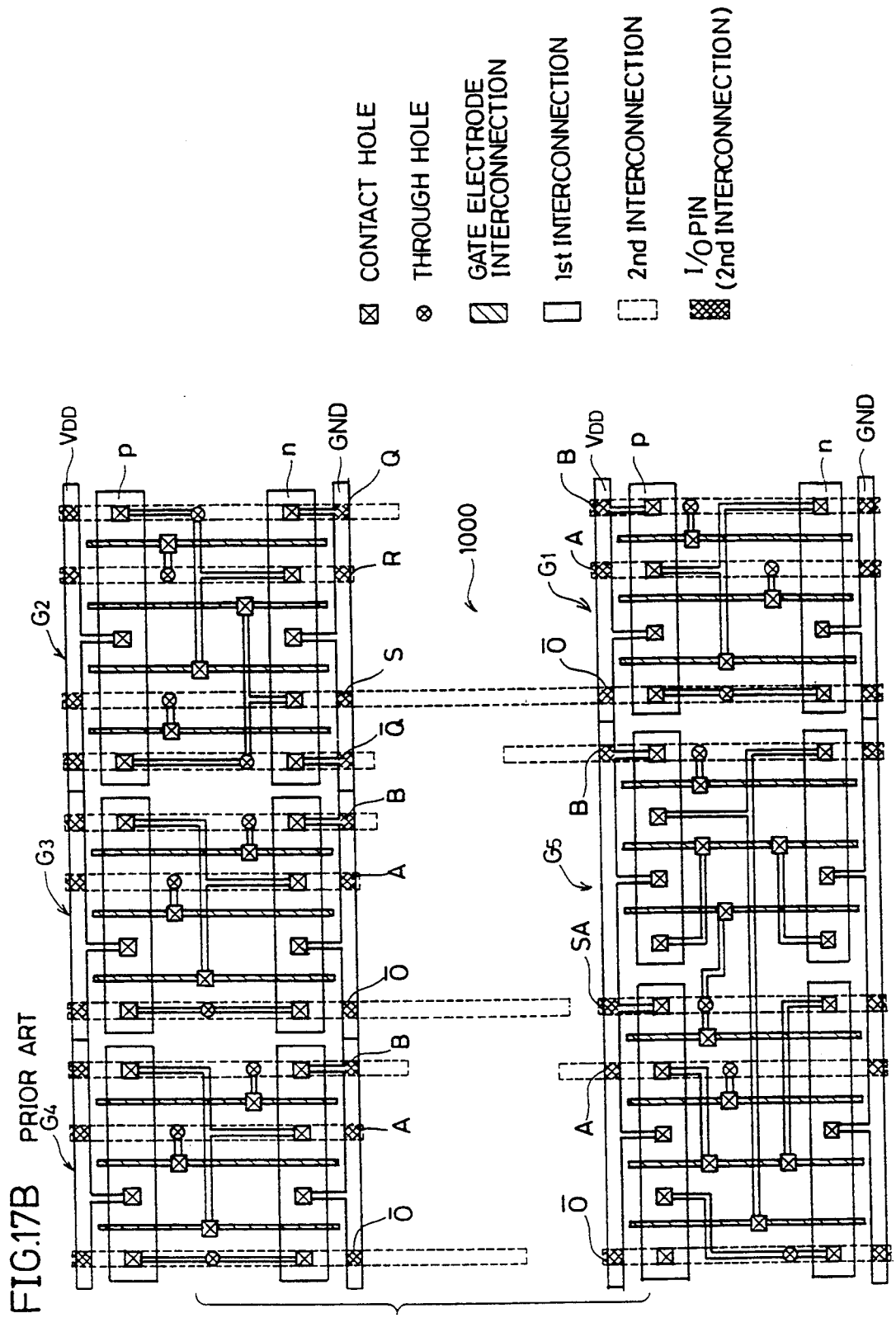
Figure 17C:
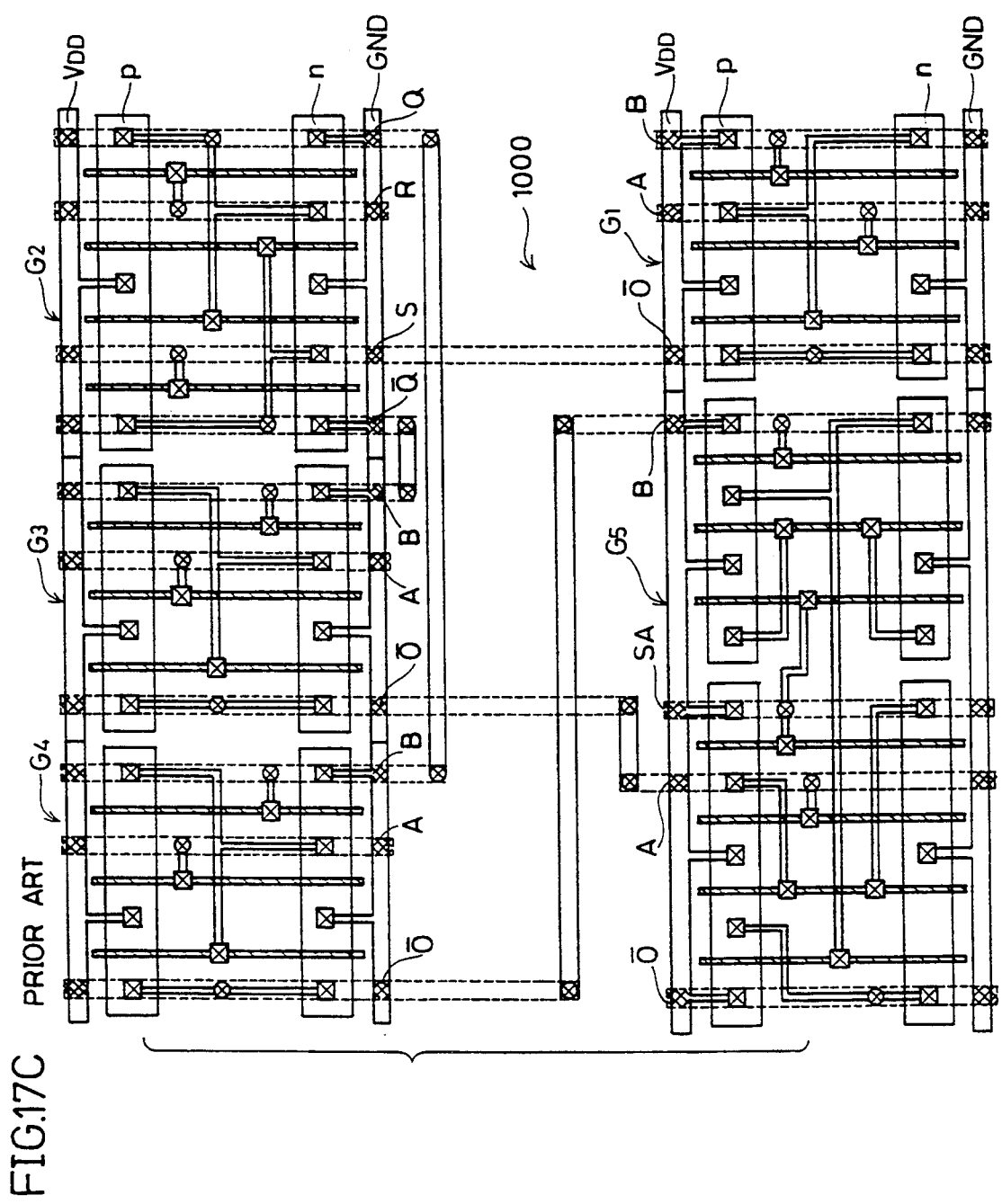
Figure 17D:
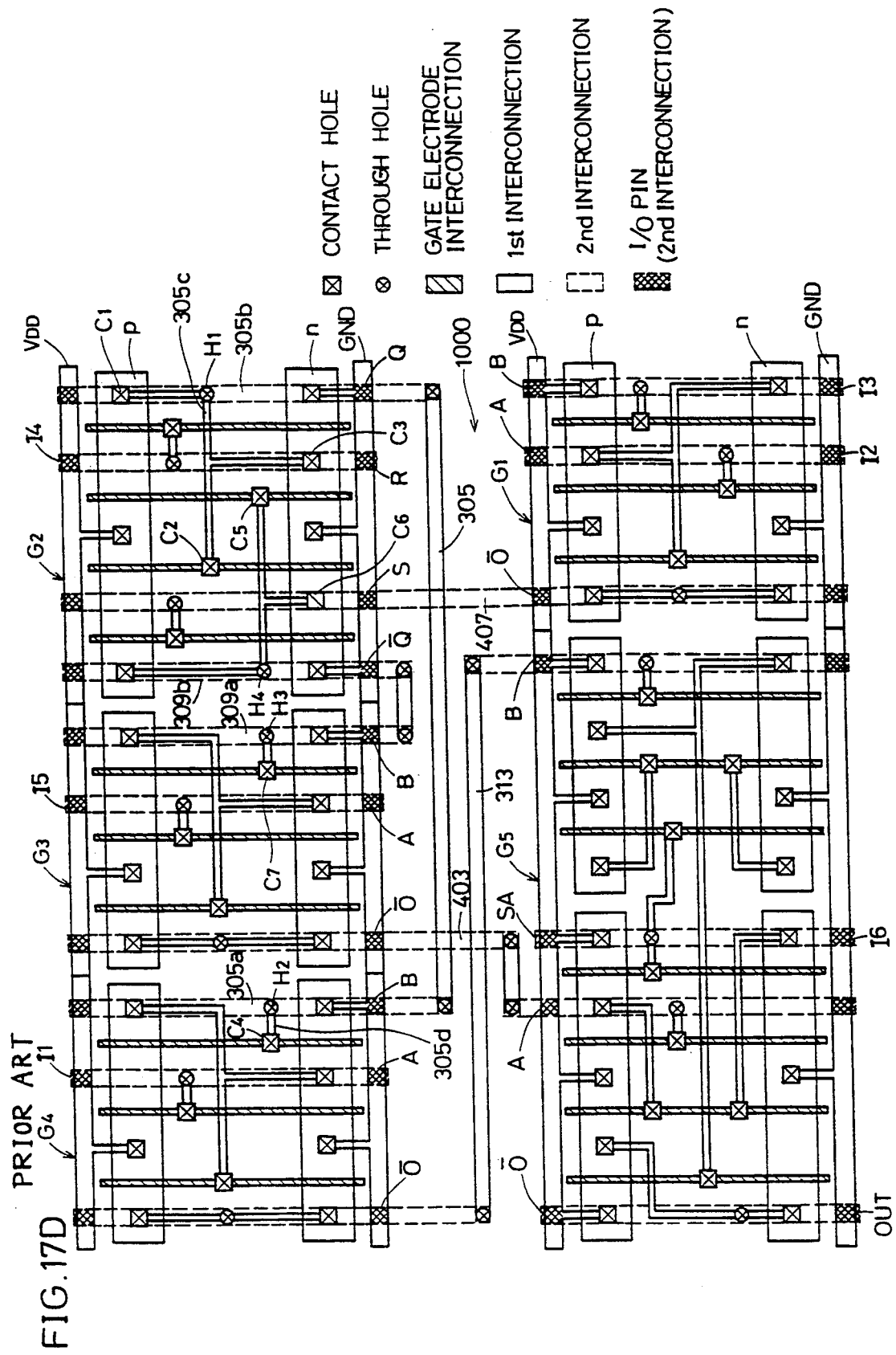

In the embodiment described above, as shown in FIG. 6F, only the first interconnection 113 and the second interconnections 203 and 207 are formed in the interconnection region 1000 between the upper layout cell group and the lower layout cell group. The prior art in FIG. 17D and the invention in FIG. 6F are compared. In FIG. 17D, the first interconnections 305 and 309 interconnecting the layout cells included in the upper layout cell group are formed in the interconnection region 1000 between the upper layout cell group and the lower layout cell group. On the other hand, in FIG. 6F showing the invention, the first interconnection 105, which corresponds to the first interconnection 305 in FIG. 17D, and the first interconnection 109, which corresponds to the first interconnection 309 in FIG. 17D, are formed in the region 2000 between the p-type layout cell group and the n-type layout cell group. Therefore, it is possible to minimize an excessive region in the interconnection region 1000 between the upper and lower layout cell groups.

Further, the first interconnection 105 in FIG. 6F is employed to interconnect the contact holes C1, C2, C3 and C4. Also, the first interconnection 305 in FIG. 17D is employed to interconnect the contact holes C1, C2, C3 and C4. However, in FIG. 17D, the layout cells of the circuit blocks G2 and G4 were integrally arranged in an earlier stage, and thus the contact holes thereof are interconnected through second interconnections 305 and 305b. More specifically, a first interconnection 305c is formed for interconnecting the contact holes C1, C2 and C3, and a second interconnection 305b is formed for the connection to the first interconnection 305c via a thorough hole H1. This second interconnection 305b is provided with the output terminal Q of the layout cells of the circuit block G2. Meanwhile, in the layout cells of the circuit block G4, a first interconnection 305d is formed for interconnecting the contact hole C4 and the input terminal B, and a second interconnection 305a which is connected to the first interconnection 305d through the through hole H2 is also formed. The input terminal B of the layout cells of the circuit block G4 is formed in this second interconnection 305a. As described above, in the conventional layout designing method, transistors contained in each layout cell are interconnected through the input terminals or output terminals provided in the layout cells of each circuit block. Therefore, excessive interconnections are formed in the layout cell of the circuit block. However, according to the invention, as shown in FIG. 6F, the contact holes C1, C2, C3 and C4 are interconnected only by the first interconnection 105. Therefore, the present invention can eliminate excessive interconnections between the transistors and thus can increase the operation speed.

Similarly, in FIG. 17D, a second interconnection 309a is formed via a through hole H3 and a second interconnection 309b is formed via a through hole H4 for interconnecting contact holes C5, C6 and C7. On the other hand, according to the invention, only the first interconnection 109 is formed, as shown in FIG. 6F, for interconnecting the contact holes C5, C6 and C7. This also eliminates excessive interconnections between the transistors.

As described above, it is possible to minimize the interconnection region 1000 between the upper layout cell group and the lower layout cell group and thus to achieve the efficient interconnections. Therefore, an occupied plane area can be reduced in the layout design corresponding to the predetermined logical circuit diagram. Further, it is also possible to eliminate the excessive interconnections between the transistors in the layout cells of the circuit blocks, and thus the operation speed can be increased.

According to the invention, as described hereinabove, the layout patterns are arranged such that they are divided into the layout patterns of the first conductivity type and the second conductivity type in the standard cell method. Therefore, the interconnections between the layout patterns can be formed in the region between the layout pattern group of the first conductivity type and the layout pattern group of the second conductivity type. Accordingly, excessive interconnection regions can be minimized, and the efficient interconnections can be achieved. This enables reduction of the occupied plane area in the layout design. Further, the excessive interconnections between the transistors can be eliminated. Therefore, the operation speed can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A layout designing method for a semiconductor integrated circuit device in which a layout of the semiconductor integrated circuit device having predetermined logical functions is designed using standard layout patterns which are designed in advance for respective logical function units, said method comprising the steps of:

dividing a predetermined logical circuit diagram into a plurality of said logical function units;

from a predetermined library, taking out said standard layout patterns, which respectively correspond to said logical function units, such that each of layout patterns is divided into a layout pattern of a first conductivity type and a layout pattern of a second conductivity type;

arranging said layout patterns including a plurality of first semiconductor devices of said first conductivity type in accordance with said logical circuit diagram;

arranging said layout patterns including a plurality of second semiconductor devices of said second conductivity type in accordance with said logical circuit diagram; and arranging an interconnection pattern for interconnecting said layout patterns in accordance with said logical circuit diagram.

2. A layout designing method for a semiconductor integrated circuit device according to claim 1, wherein said layout pattern of said first conductivity type includes an impurity region pattern of the first conductivity type, a first gate electrode pattern and an interconnection pattern for supplying a first potential; and said layout pattern of said second conductivity type includes an impurity region pattern of the second conductivity type, a second gate electrode pattern and an interconnection pattern for supplying a second potential.

3. A layout designing method for a semiconductor integrated circuit device according to claim 2, wherein each of said impurity region patterns of said first and second conductivity types includes a plurality of impurity region patterns which are aligned and spaced from each other in a first direction and have predetermined widths, respectively;

said first gate electrode pattern includes a plurality of gate electrode patterns which are formed between said impurity region patterns of said first conductivity type, spaced in said first direction and extend in a second direction crossing said first direction;

said second gate electrode pattern includes a plurality of gate electrode patterns which are formed between said impurity region patterns of said second conductivity type, spaced in said first direction and extend in the second direction crossing said first direction;

said interconnection pattern for supplying said first potential includes an interconnection pattern which is spaced from said impurity pattern of said first conductivity type and extends in said first direction; and said interconnection pattern for supplying said second potential includes an interconnection pattern which is spaced from said impurity pattern of said second conductivity type and extends in said first direction.

4. A layout designing method for a semiconductor integrated circuit device according to claim 3, wherein said step of arranging said layout pattern of said first conductivity type and said step of arranging said layout pattern of said second conductivity type include the step of arranging layout patterns of first and second conductivity types such that said impurity region patterns of said first and second conductive types are located opposite from each other.

5. A layout designing method for a semiconductor integrated circuit device according to claim 4, wherein said step of arranging said interconnection pattern includes the steps of:

arranging a gate electrode interconnection pattern extending in said second direction for interconnecting said first gate electrode pattern and said second gate electrode pattern;

arranging a first interconnection pattern, which interconnects said gate electrode interconnection pattern and said impurity region pattern, in a region between said impurity region patterns of said first and second conductive types which are opposed to each other; and arranging a second interconnection pattern for interconnecting said first interconnection patterns.

* * * * *